United States Patent
Krasovitsky et al.

(10) Patent No.: US 10,833,521 B2
(45) Date of Patent: Nov. 10, 2020

(54) FORMATION METHOD FOR PREPARING A FAST-CHARGING LITHIUM ION CELL

(71) Applicant: StoreDot Ltd., Herzeliya (IL)

(72) Inventors: Leonid Krasovitsky, Rishon LeTzion (IL); Vladimir Seleznyov, Netanya (IL); Daniel Aronov, Netanya (IL)

(73) Assignee: STOREDOT LTD., Herziliya (IL)

( * ) Notice: Subject to any disclaimer, the term of this patent is extended or adjusted under 35 U.S.C. 154(b) by 0 days.

(21) Appl. No.: 16/180,066

(22) Filed: Nov. 5, 2018

(65) Prior Publication Data

US 2019/0074704 A1    Mar. 7, 2019

Related U.S. Application Data

(63) Continuation-in-part of application No. 15/867,764, filed on Jan. 11, 2018, now Pat. No. 10,122,042.

(60) Provisional application No. 62/445,299, filed on Jan. 12, 2017.

(51) Int. Cl.
*H02J 7/00*       (2006.01)
*H01M 10/0525*    (2010.01)
*G01R 31/382*     (2019.01)
*H01M 4/04*       (2006.01)
*G01R 31/385*     (2019.01)

(52) U.S. Cl.
CPC .......... *H02J 7/0069* (2020.01); *G01R 31/382* (2019.01); *H01M 4/0445* (2013.01); *H01M 10/0525* (2013.01); *H02J 7/007* (2013.01); *H02J 7/0068* (2013.01); *G01R 31/3865* (2019.01)

(58) Field of Classification Search
CPC .......... Y02E 60/12; G01R 31/3648; G01R 31/3651; G01R 31/3624; H02J 7/0047
See application file for complete search history.

(56) References Cited

U.S. PATENT DOCUMENTS

| | | |
|---|---|---|
| 5,393,617 A | 2/1995 | Klein |
| 9,406,927 B1 | 8/2016 | Burshtain et al. |
| 10,122,042 B2 | 11/2018 | Krasovitsky et al. |

(Continued)

FOREIGN PATENT DOCUMENTS

WO    WO 2018/109774    6/2018

OTHER PUBLICATIONS

Office Action for corresponding U.S. Appl. No. 16/012,781, dated Sep. 19, 2019.

(Continued)

*Primary Examiner* — Arun C Williams
(74) *Attorney, Agent, or Firm* — Oren Reches

(57) ABSTRACT

Methods, systems and battery modules are provided, which increase the cycling lifetime of fast charging lithium ion batteries. During the formation process, the charging currents are adjusted to optimize the cell formation, possibly according to the characteristics of the formation process itself, and discharge extents are partial and optimized as well, as is the overall structure of the formation process. During operation, voltage ranges are initially set to be narrow, and are broadened upon battery deterioration to maximize the overall lifetime. Current adjustments are applied in operation as well, with respect to the deteriorating capacity of the battery. Various formation and operation strategies are disclosed, as basis for specific optimizations.

12 Claims, 20 Drawing Sheets

(56) References Cited

U.S. PATENT DOCUMENTS

| | | | |
|---|---|---|---|
| 10,199,677 B2 | 2/2019 | Drach et al. | |
| 2003/0193318 A1 | 10/2003 | Ozawa et al. | |
| 2006/0033469 A1* | 2/2006 | Beaty | B60L 3/0046 |
| | | | 320/104 |
| 2007/0126404 A1 | 6/2007 | Iida et al. | |
| 2009/0035664 A1 | 2/2009 | Chiang et al. | |
| 2009/0117466 A1 | 5/2009 | Zhamu et al. | |
| 2009/0128097 A1 | 5/2009 | Esnard | |
| 2009/0153100 A1 | 6/2009 | Okumura et al. | |
| 2009/0160403 A1 | 6/2009 | Takeno et al. | |
| 2009/0291368 A1 | 11/2009 | Newman et al. | |
| 2010/0052616 A1* | 3/2010 | Takada | H01M 10/4207 |
| | | | 320/130 |
| 2010/0264929 A1 | 10/2010 | Ugaji et al. | |
| 2013/0202945 A1 | 8/2013 | Zhamu et al. | |
| 2013/0307485 A1 | 11/2013 | He et al. | |
| 2013/0319870 A1 | 12/2013 | Checn et al. | |
| 2014/0272534 A1 | 9/2014 | Ueki et al. | |
| 2016/0344068 A1 | 11/2016 | Kim et al. | |
| 2017/0294687 A1 | 10/2017 | Burshtain et al. | |
| 2018/0115024 A1 | 4/2018 | Sugeno et al. | |
| 2019/0148774 A1 | 5/2019 | Kuks et al. | |

OTHER PUBLICATIONS

Ning et al. "Cycle Life Modeling of Lithium-Ion Batteries", Journal of the Electrochemical Society, Jan. 1, 2004, vol. 151, No. 10, pp. A1584-A1591.

U.S. Office Action for U.S. Appl. No. 15/867,764, dated May 10, 2018.

* cited by examiner

FORMATION METHOD FOR PREPARING A FAST-CHARGING LITHIUM ION CELL

CROSS REFERENCE TO RELATED APPLICATIONS

This application in a continuation-in-part of U.S. patent application Ser. No. 15/867,764, filed on Jan. 11, 2018, which claims the benefit of U.S. Provisional Patent Application No. 62/445,299 filed on Jan. 12, 2017, all of which are incorporated herein by reference in their entirety.

BACKGROUND OF THE INVENTION

1. Technical Field

The present invention relates to the field of lithium ion batteries, and more particularly, to formation processes and operation patterns which increase the cycling lifetime of fast-charging lithium ion batteries.

2. Discussion of Related Art

Lithium ion batteries are typically used as energy storage devices for supplying power for various devices and appliances, and operate by lithiation of lithium ions from the electrolyte into the anode material (intercalation in case of graphite anodes), wherein in initial charging and discharging cycles, a SEI (solid-electrolyte interphase) layer is formed by interaction between electrolyte components and Li ions on the anode surface, and supports proper later operation of the cells in terms of cell capacity, cycle life and degradation mechanism.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method of preparing a fast-charging lithium ion cell for use by forming a solid-electrolyte interphase (SEI) in the anode, the method comprising: performing a first cycle of fully charging the cell and consecutively discharging the cell, and performing, consecutively, a plurality of charge-discharge cycles, in which the cell is charged and discharged to any value between 30-80% (or between 20%-80% or between 10%-90%) of maximal cell capacity in each of the cycles.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
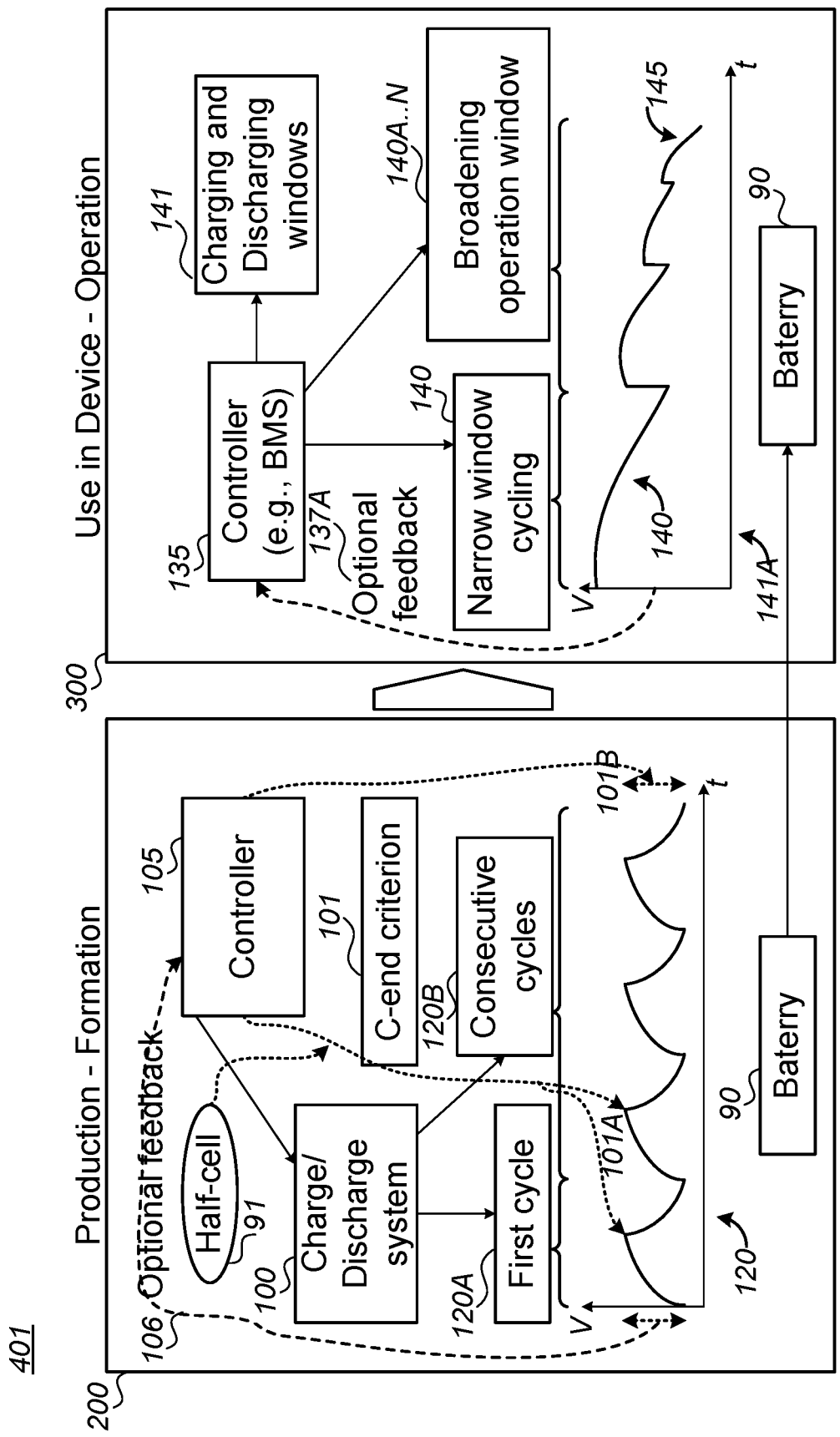
FIGS. 1-3 are high-level schematic illustrations of systems and methods for increasing the cycle life of fast-charging lithium ion batteries, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. Any of the disclosed modules or units may be at least partially implemented by a computer processor.

Embodiments of the present invention provide efficient and economical methods and mechanism for preparing lithium ion cells for prolonged operation, particularly under fast charging scenarios, by forming a stable SEI, and thereby provide improvements to the technological field of fast charging batteries.

Methods, systems and battery modules are provided, which increase the cycling lifetime of fast charging lithium ion batteries. During the formation process, the charging currents are adjusted to optimize the cell formation, possibly according to the characteristics of the formation process itself, and discharge extents are partial and optimized as well, as is the overall structure of the formation process. During operation, voltage ranges are initially set to be narrow, and are broadened upon battery deterioration to maximize the overall lifetime. Current adjustments are applied in operation as well, with respect to the deteriorating capacity of the battery. Various formation and operation strategies are disclosed, as basis for specific optimizations.

Cells and methods are provided, which improve the SEI (solid-electrolyte interface) formation process and provide fast-charging lithium ion cells with prolonged lifetime due to increased SEI stability. SEI formation methods are characterized by partial charging and/or discharging in at least some of the SEI formation cycles, for example full charging and discharging in a first cycle followed by partial charging and discharging in consecutive cycles; or partial charging and discharging in a first cycle followed by partial charging and discharging in consecutive cycles. SEI formation methods may comprise using low currents.

Disclosed embodiments relate mainly to fast charging batteries, which are characterized by high charging and/or discharging rates (C-rate), ranging from 3-10 C-rate, 10-100 C-rate or even above 100 C, e.g., 5 C, 10 C, 15 C, 30 C, 100 C or more. It is noted that the term C-rate is a measure of the rate of charging and/or discharging of cell/battery capacity, e.g., with 1 C denoting charging and/or discharging the cell in an hour, and XC (e.g., 5 C, 10 C, 50 C etc.) denoting charging and/or discharging the cell in 1/X of an hour—with respect to a given capacity of the cell. In certain embodiments, the terms charging currents and C-rates are used interchangeably in a non-limiting manner, relating to given cell capacities and/or cell capacities determined as disclosed.

The inventors have found out that the lifetime of fast-charging lithium ion batteries may be extended by delivering power from the batteries within a narrow voltages range when the battery is relatively fresh and has high capacity, and broadening the voltages range only once the resistance of the battery increases and its capacity decreases. This operation scheme is contrary and superior to prior art operation of lithium batteries within the full voltages range from the start. The inventors have found out that disclosed operation schemes increase the lifetime of the fast-charging lithium ion batteries.

Fast-charging lithium ion batteries, charging management modules and methods are provided, which modify the range of voltage levels supplied by the battery according to a state of health of the battery, starting from a narrow range and reaching a wider range—to maximize the battery lifetime. The range of supplied voltage levels may be determined according to the resistance of the battery to minimize the loss of capacity of the battery and thereby increase its lifetime.

Embodiments of the present invention provide efficient and economical methods and mechanisms for improving battery performance by controlling its output voltage levels and thereby provide improvements to the technological field of fast-charging lithium ion batteries.

In certain embodiments, fast-charging lithium ion batteries may comprise any number of cells, having respective anode(s), cathode(s), separator(s) and electrolyte(s) made of any of a variety of materials. For example, anodes may be made of anode material in form of anode material particles (e.g., having a diameter of 100-500 nm), which may comprise e.g., particles of metalloids such as silicon, germanium and/or tin, and/or possibly particles of lithium titanate (LTO), possibly particles of aluminum, lead and/or zinc, and may further include various particle surface elements (e.g., having a diameter of 10-50 nm or less) such nanoparticles (e.g., $B_4C$, WC, VC, TiN), borate and/or phosphate salt(s) and/or nanocrystals and possibly polymer coatings (e.g., conductive polymers, lithium polymers). Anode(s) may be made from anode slurry prepared by ball milling processes and may further comprise additive(s) such as binder(s), plasticizer(s) and/or conductive filler(s). In certain embodiments, anode(s) may be graphite or graphene-based. Cathode(s) may comprise materials based on layered, spinel and/or olivine frameworks, and comprise various compositions, such as LCO formulations (based on $LiCoO_2$), NMC formulations (based on lithium nickel-manganese-cobalt), NCA formulations (based on lithium nickel cobalt aluminum oxides), LMO formulations (based on $LiMn_2O_4$), LMN formulations (based on lithium manganese-nickel oxides) LFP formulations (based on $LiFePO_4$), lithium rich cathodes, and/or combinations thereof. Separator(s) may comprise various materials, such as polyethylene (PE), polypropylene (PP) or other appropriate materials. Electrolyte(s) may comprise any of a wide range of corresponding fluids, such as carbonate-based cyclic and linear compounds provided below.

Figure 2:
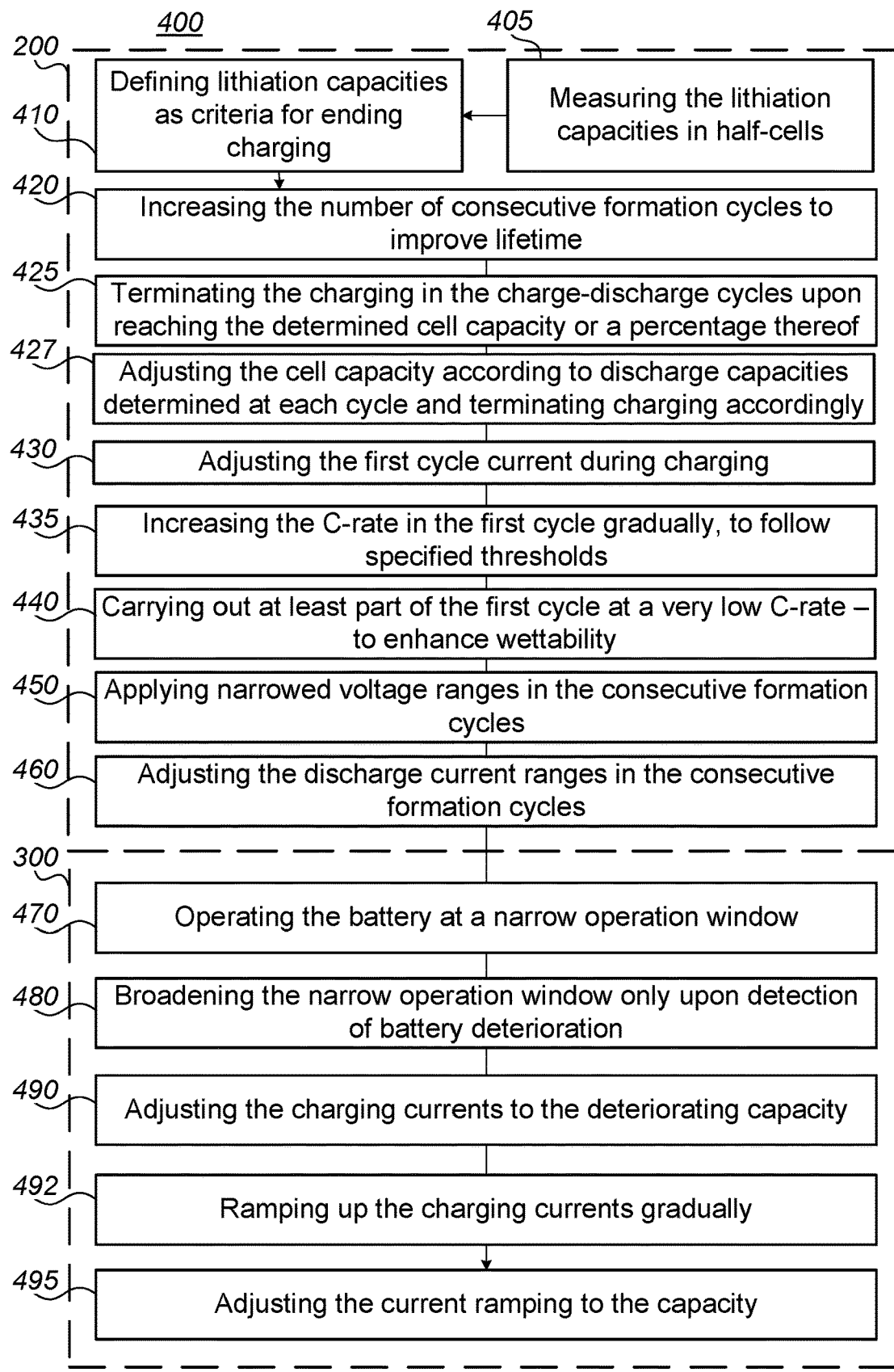
Figure 3:
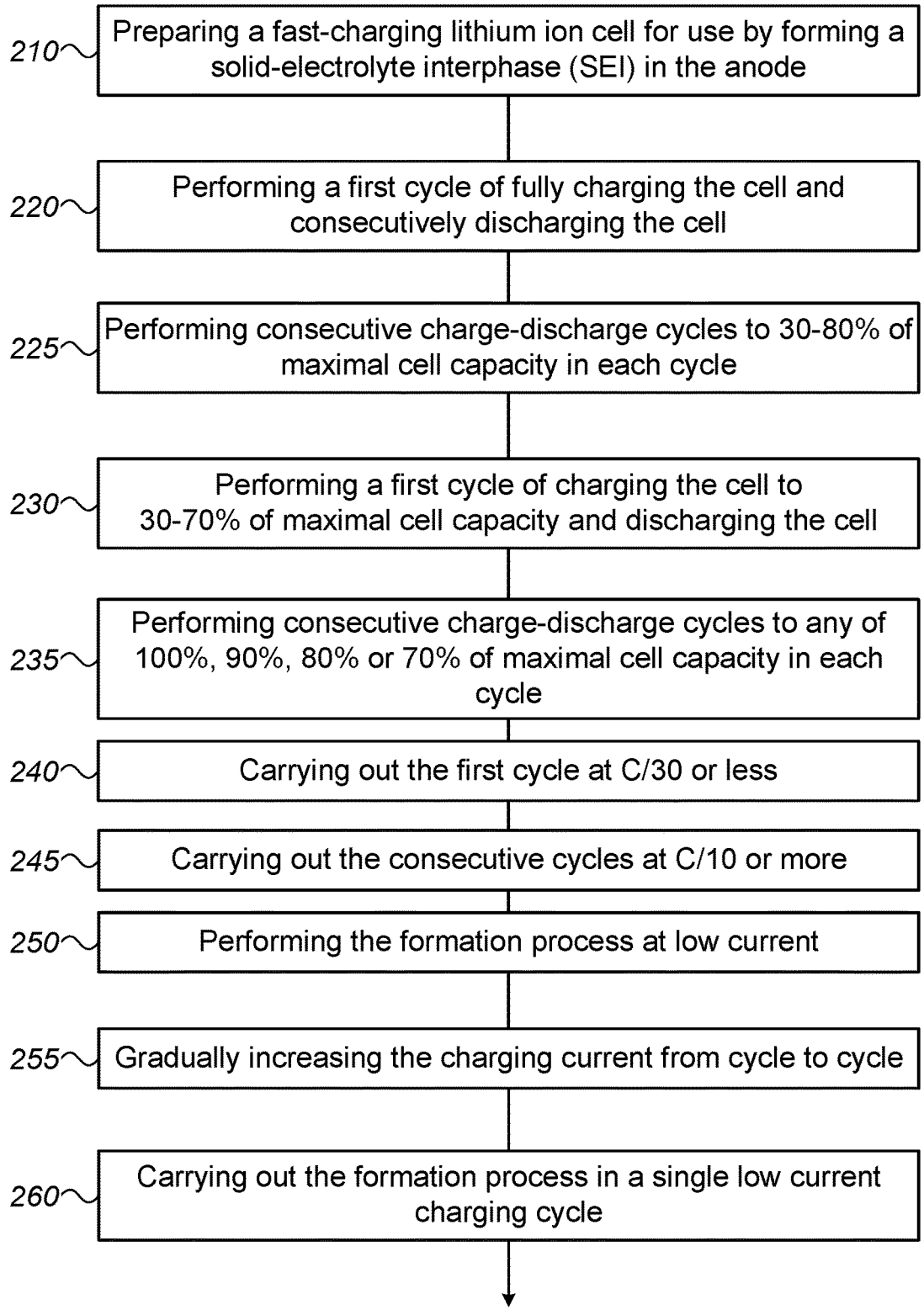
Figure 3:
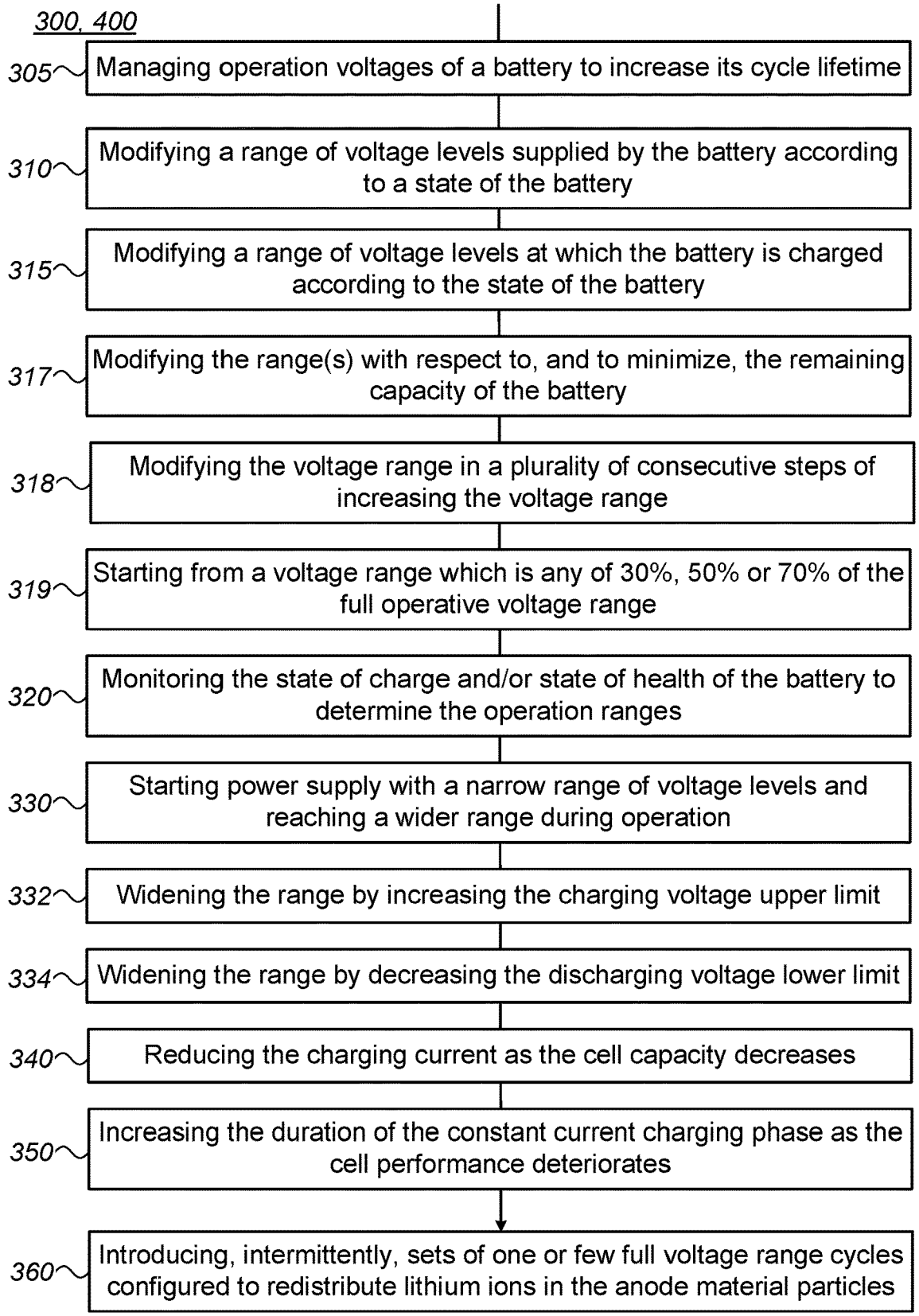

FIGS. 1, 2 and 3 are high-level schematic illustrations of systems 401 and methods 400 for increasing the cycle life of fast-charging lithium ion batteries, according to some embodiments of the invention.

FIG. 1 is a high-level schematic block diagram illustrating battery formation and operation systems 401, according to some embodiments of the invention. Formation processes 200, which are typically carried out at the battery production factory, and operation processes 300, which are typically carried out by the users of batteries 90, are configured and optimized in disclosed embodiments primarily to increase the cycle life of batteries 90, namely the number of charging and discharging cycles battery 90 can go through before reaching a predefined deterioration of its performance (e.g., capacity reaching 80% of an original capacity, or a specified value). During formation 200, a charge/discharge system 100 controlled by controller 105 as a charging management module, is configured to carry out formation cycles 120 comprising multiple charging and discharging steps of battery 90, typically characterized as a first cycle 120A and consecutive cycles 120B. Examples for cycle characteristics which may be determined by controller 105 are the end of charging (C-end) criterion 101 (an example 101A denoted on the schematic formation curve) and the extent of charging (maximal capacity or voltage) and discharging (depth of discharge DoD), denoted schematically by numeral 101B. Certain embodiments disclosed below provide ways of defining these criteria to optimize the formation process, e.g., my initially measuring lithiation capacities of the anodes and cathodes in half cells 91 and using the measured quantities to define formation criteria 101A, 101B, as well as optionally providing feedback 106 from formation curve 120 of battery 90 to modify formation criteria 101A, 101B during formation 200 itself, or as a way to derive formation parameters for formation processes 200 of batteries that follow. During operation 300, a controller 135 such as a battery management system (BMS) which may be at least partly integrated with battery 90 determines charging and/or discharging windows 141 of battery 90 in the device, depending on its use. Charging and/or discharging windows 141 determine an operation curve 141A of battery 90, which in disclosed embodiments, typically starts with narrow voltage range window cycling 140 and the voltage range window is gradually increased (140A . . . N) as battery 90 deteriorates, up to a maximal voltage range 145 in which the battery is operable (and which is the prior art default operation voltage range). Optionally feedback 137A may be provided to controller 135 to optimize the modifications in charging windows. Parameters derived from formation process 200 may be used in controlling the cycles of operation process 300, as disclosed below.

As illustrated schematically in FIGS. 2 and 3, method 400 may comprise conducting a formation process of the battery (stage 200) and operating the battery (stage 300) according to embodiments of the invention—to extend a cycling life time of the fast charging lithium ion battery.

Methods 400 may comprise conducting formation process 200 of the battery by performing a first cycle of fully charging the battery at a rate of less than C/30 and consecutively discharging the battery (stage 240), and, consecutively, performing a plurality of charge-discharge cycles e.g., at C/10 or more, e.g., C/5 (stage 245). In various embodiments, the first cycle may be carried out at e.g., 0.1 C, 0.03 C, 0.01 C or values in-between, and consecutive cycles may be carried out at 0.2 C, 0.1 C, 0.05 C, possibly higher values such as 0.5 C or even 1 C, or values in-between. In certain embodiments, first cycle may be carried out at a variable rate, starting e.g., from 0.1 C, 0.03 C, 0.02 C, 0.01 C or values in-between and increasing (e.g., step-wise and/or gradually) during the first cycle to e.g., 0.2 C, 0.3 C, 0.5 C, possibly to higher values such as 1 C or values in-between, until the end of the first cycle.

In formation process 200, method 400 may further comprise determining, prior to the first cycle, a cell capacity as the lower between a first lithiation capacity of the anode and a first delithiation capacity of the cathode (stage 410)—measured in a half cell with respect to lithium (stage 405), and terminating the full charging in the first cycle upon reaching the determined cell capacity (C) as a criterion for ending the charging in the first cycle (stage 410). For example, the cell capacity may be defined as indicated in Equations 1:

$$C_0 \text{ (mAh)} = \text{Min (Cathode material mass inside the cell} \cdot C_c, \text{ Anode material mass inside the cell} \cdot C_a),$$

with:

$$C_c \text{ (mAh/gr)} = 1^{st} \text{ delithiation capacity of cathode vs. Li metal in the half cell}$$

$$C_a \text{ (mAh/gr)} = 1^{st} \text{ lithiation capacity of anode vs. Li metal in the half cell} \quad \text{Equations 1}$$

In a non-limiting example, the first formation cycle may be carried out at $C_0/30$ rate to full charge, followed by discharge, and consecutive cycles may be four or more at $C_1/10$ rate with $C_1$ being the discharge capacity measured or estimated after the first cycle. Method 400 may comprise increasing the number of consecutive formation cycles (stage 420), found out by the inventors to improve lifetime of the formed battery.

In certain embodiments of formation process 200, method 400 may further comprise terminating the charging in the plurality of charge-discharge cycles upon reaching the determined cell capacity, or a specified percentage thereof (stage 425)—as illustrated schematically by numeral 101A in FIG. 1, which correspond to a charging-end criterion 101 such as reaching the determined cell capacity, or a specified percentage thereof. In certain embodiments of formation process 200, method 400 may further comprise adjusting the cell capacity according to discharge capacities determined at each cycle, and terminating the charging in each cycle accordingly (stage 427). In either case, adjusting charging-end criterion 101 (at any of formation stages 120 such as first or consecutive cycles 120A, 120B, respectively) may be configured to optimize the efficiency and duration of the formation process.

Figure 4:
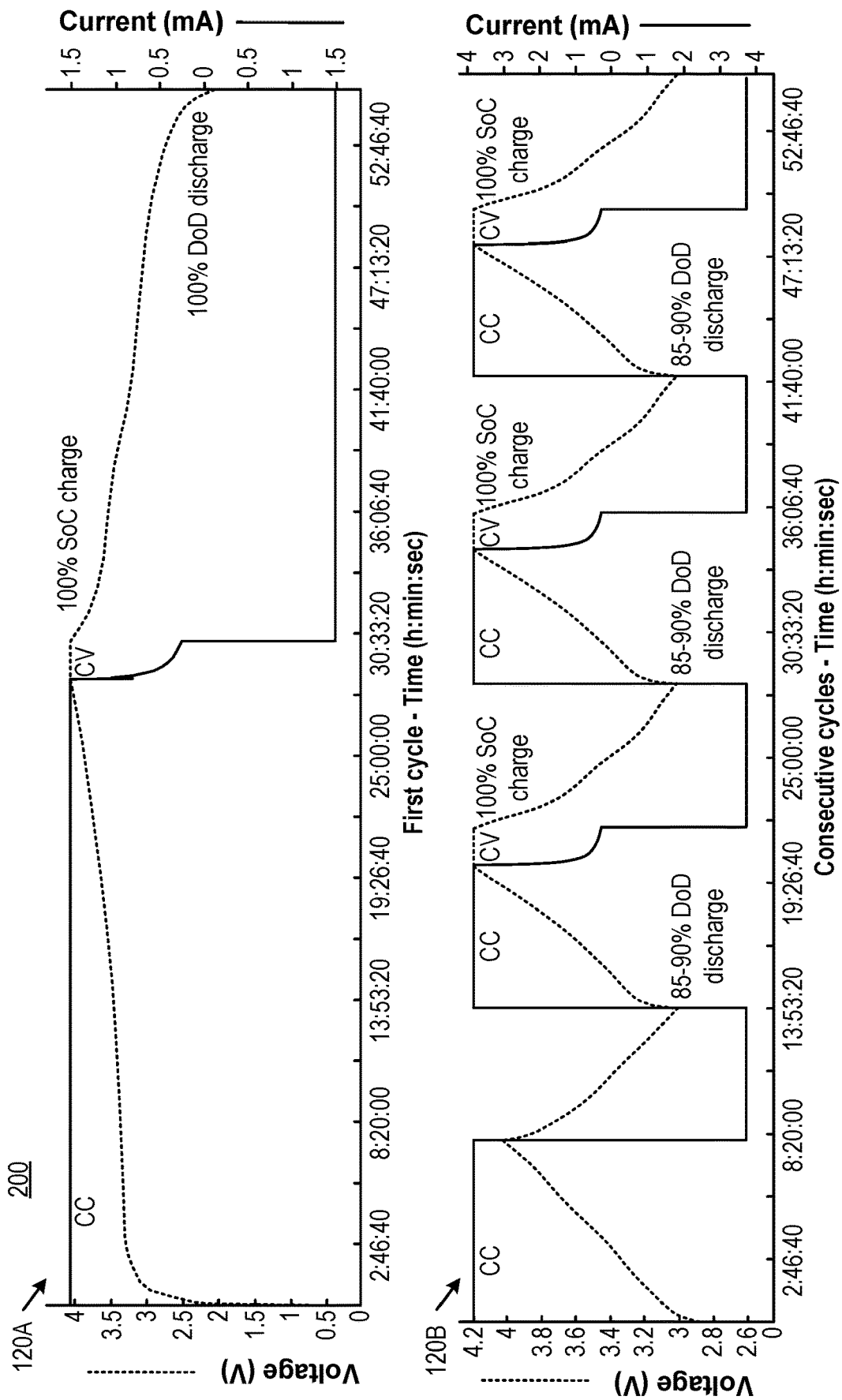
FIGS. 4 and 5 provide non-limiting examples for formation processes, according to some embodiments of the invention.

In a non-limiting example, the first formation cycle may be carried out at $C_0/30$ rate to full charge, followed by four or more cycles at $C_1/10$ rate with $C_1$ being the discharge capacity measured or estimated after the first cycle. Method 400 may comprise increasing the number of consecutive formation cycles (stage 420), e.g., to four charge-discharge cycles or more, which was found by the inventors to improve lifetime of the formed battery. FIG. 4 provides a non-limiting example for formation process 200, according to some embodiments of the invention. FIG. 4 illustrates CC-CV (constant current-constant voltage) first and consecutive formation cycles 120A, 120B, respectively, with four consecutive formation cycles 120B. This non-limiting example for formation and operation resulted in improved cell lifetime with respect to prior art formation without the limitation of cell capacity and with less than four, typically one or two consecutive formation cycles, yet the formation process is quite time consuming, taking ca. 120 hours.

In certain embodiments of formation process 200, method 400 may further comprise adjusting the current of the charging stage of the first cycle during charging (stage 430) according to any of a variety of cell parameters, such as cell resistance, current change and/or derivatives (e.g., first, second) of the voltage-time curve. For example, in formation process 200, method 400 may further comprise gradually increasing a C-rate, equivalent to increasing the charging current, during at least the first cycle, gradually, possibly to follow specified thresholds (stage 435), e.g., from at most C/50 to at most C/30. The rate of increasing the charging current may be determined in realtime, with respect to cell measurements as disclosed herein, or may be predetermined, e.g., according to initial checks, or former experience, modelling or estimations. In certain embodiments, the charging rate at the first cycle may increase e.g., tenfold (10×), during the first cycle. In various embodiments, the charging rate at the first cycle may increase by between twofold (2×) and one-hundred-fold (×100), during the first cycle.

In certain embodiments of formation process 200, method 400 may further comprise carrying out at least part of the first cycle at a very low C-rate—to enhance wettability (stage 440). The inventors have found out that low initial formation currents (e.g., C/77) enhance electrolyte wetting of the electrodes surface due to the potential between the battery poles. Applying small currents, at least initially, achieves high potential difference between the positive and negative terminals and enhances the wetting process. For example, the initial formation current may be any of C/60, C/70, C/80 or lower charge rates. In certain embodiments, the charging in the first cycle may be performed at a rate of less than C/50 at least during a third of a charging duration. In certain embodiments, the first cycle may be carried out by gradually increasing a charging current, during the first cycle, from at most C/70 to at most C/50 during at least a third of a charging duration. In certain embodiments, low initial formation currents may be applied during shorter or longer parts of the first cycles, e.g., during 1/10, 1/5 or 1/4 of the duration of the first cycle; of alternatively during 1/2 or 2/3 of the duration of the first cycle, respectively. For example, Table 1 provides a non-limiting example for gradual current increases during first cycle 120A. In the example, the charging current may be increased gradually in five steps (as a non-limiting example), each characterized by a range of charging currents (expressed in relation to the C-rate) and a range of durations for each of the steps, according to some embodiments of the invention. Each of the steps may be broken down into smaller steps, or combined with consecutive steps, with its specific time limitations. The change from step to step may be linear and/or step-like and/or polynomial of the form $aX^3+bX^2+cX+d$, or any other form, where X is the time and a-d are coefficients. In certain embodiments, the current may be raised by any function of the time, step-wise or continuously, pre-determined or modified during the first formation cycle. Table 2 provides two non-limiting examples for the gradual current increases and optional voltage increases with different limitations, according to some embodiments of the invention

TABLE 1

A non-limiting example for gradual current increases during the first formation cycle.

| Step # | Lower charging rate limit | Upper charging rate limit | Lower time limit (hours) | Upper time limit (hours) |
|---|---|---|---|---|
| 1 | 0.0125 C | 0.033 C | 0.2 | 5 |
| 2 | 0.033 C | 0.05 C | 0.2 | 5 |
| 3 | 0.05 C | 0.1 C | 0.2 | 5 |
| 4 | 0.1 C | 0.5 C | 0.2 | 5 |
| 5 | 0.5 C | 1 C | 0.2 | 5 |

TABLE 2 two non-limiting examples for the gradual current increases and optional voltage increases with different limitations.

| 4.2 V limitation (full charge) | | | | 4 V limitation (partial charge) | | | |
|---|---|---|---|---|---|---|---|
| Time (hour:min:sec) | C-rate | V limit (V) | | Time (hour:min:sec) | C-rate | V limit (V) | |
| 2:00:00 | 0.0013 C | 3.9 | Low | 2:00:00 | 0.0013 C | 3.8 | Low |
| 2:00:00 | 0.0025 C | 3.9 | charging | 2:00:00 | 0.0025 C | 3.8 | charging |
| 2:00:00 | 0.0038 C | 3.9 | currents, | 2:00:00 | 0.0038 C | 3.8 | currents. |
| 2:00:00 | 0.0050 C | 3.9 | Voltage | 2:00:00 | 0.0050 C | 3.8 | |
| 2:00:00 | 0.0063 C | 3.9 | increases. | 2:00:00 | 0.0063 C | 3.8 | |
| 2:00:00 | 0.0075 C | 3.9 | | 2:00:00 | 0.0075 C | 3.8 | |
| 2:00:00 | 0.0088 C | 3.9 | | 2:00:00 | 0.0088 C | 3.8 | |
| 2:00:00 | 0.0100 C | 3.9 | | 2:00:00 | 0.0100 C | 3.8 | |
| 2:00:00 | 0.0113 C | 3.9 | | 2:00:00 | 0.0113 C | 3.8 | |
| 2:00:00 | 0.0125 C | 3.95 | | 2:00:00 | 0.0125 C | 3.8 | |
| 2:00:00 | 0.0375 C | 4 | Gradual | 2:00:00 | 0.0250 C | 3.8 | |
| 2:00:00 | 0.0500 C | 4 | current | 2:00:00 | 0.0375 C | 3.8 | |
| 2:00:00 | 0.0625 C | 4 | increase. | 2:00:00 | 0.0500 C | 3.8 | |
| 1:00:00 | 0.0750 C | 4 | Gradual | 2:00:00 | 0.0625 C | 3.8 | |
| 0:55:00 | 0.0875 C | 4 | duration | 1:00:00 | 0.0750 C | 3.8 | Gradual |
| 0:50:00 | 0.1000 C | 4 | decrease. | 0:55:00 | 0.0875 C | 3.8 | current |
| 0:45:00 | 0.1125 C | 4 | | 0:50:00 | 0.1000 C | 3.8 | increase. |
| 0:40:00 | 0.1250 C | 4 | | 0:45:00 | 0.1125 C | 3.8 | Gradual |
| 0:35:00 | 0.1375 C | 4 | | 0:40:00 | 0.1250 C | 3.8 | duration |
| 0:30:00 | 0.1500 C | 4 | | 0:35:00 | 0.1375 C | 3.8 | decrease. |
| 0:25:00 | 0.1625 C | 4 | | 0:30:00 | 0.1500 C | 3.8 | |
| 0:20:00 | 0.1750 C | 4 | | 0:25:00 | 0.1625 C | 3.8 | |
| 0:20:00 | 0.1875 C | 4 | | 0:20:00 | 0.1750 C | 3.8 | |
| 0:20:00 | 0.2000 C | 4 | | 0:20:00 | 0.1875 C | 3.8 | |
| 0:20:00 | 0.2125 C | 4 | | 0:20:00 | 0.2000 C | 3.8 | |
| 0:20:00 | 0.2250 C | 4 | | 0:20:00 | 0.2125 C | 3.8 | |

TABLE 2-continued two non-limiting examples for the gradual current increases and optional voltage increases with different limitations.

| 4.2 V limitation (full charge) | | | | 4 V limitation (partial charge) | | | |
|---|---|---|---|---|---|---|---|
| Time (hour:min:sec) | C-rate | V limit (V) | | Time (hour:min:sec) | C-rate | V limit (V) | |
| 0:20:00 | 0.2375 C | 4 | | 0:20:00 | 0.2250 C | 3.8 | |
| 0:20:00 | 0.2500 C | 4 | | 0:20:00 | 0.2375 C | 3.8 | |
| 0:20:00 | 0.2625 C | 4 | | 0:20:00 | 0.2500 C | 3.8 | |
| 0:20:00 | 0.2750 C | 4 | | 0:20:00 | 0.2625 C | 3.8 | |
| 0:20:00 | 0.2875 C | 4 | | 0:20:00 | 0.2750 C | 3.8 | |
| 0:20:00 | 0.3000 C | 4 | | 0:20:00 | 0.2875 C | 3.8 | |
| 0:20:00 | 0.3125 C | 4 | | 0:20:00 | 0.3000 C | 3.8 | |
| 0:20:00 | 0.3250 C | 4 | | 0:20:00 | 0.3125 C | 3.8 | |
| 0:20:00 | 0.3375 C | 4 | | 0:20:00 | 0.3250 C | 3.8 | |
| 0:20:00 | 0.3500 C | 4 | | 0:20:00 | 0.3375 C | 3.8 | |
| 0:20:00 | 0.3625 C | 4 | | 0:20:00 | 0.3500 C | 3.8 | |
| 0:30:00 | 0.3750 C | 4 | | 0:20:00 | 0.3625 C | 3.8 | |
| 0:20:00 | 0.3875 C | 4 | | 0:30:00 | 0.3750 C | 3.8 | |
| 0:20:00 | 0.4000 C | 4 | | 0:20:00 | 0.3875 C | 3.8 | |
| 0:20:00 | 0.4125 C | 4 | | 0:20:00 | 0.4000 C | 3.8 | |
| 0:20:00 | 0.4250 C | 4 | | 0:20:00 | 0.4125 C | 3.8 | |
| 0:20:00 | 0.4375 C | 4 | | 0:20:00 | 0.4250 C | 3.8 | |
| 0:20:00 | 0.4500 C | 4 | Voltage | 0:20:00 | 0.4375 C | 3.8 | |
| 0:15:00 | 0.4625 C | 4.05 | increase to | 0:20:00 | 0.4500 C | 3.8 | |
| 0:10:00 | 0.4750 C | 4.1 | limit, | 0:15:00 | 0.4625 C | 3.85 | Voltage |
| 0:05:00 | 0.4875 C | 4.15 | completion | 0:10:00 | 0.4750 C | 3.9 | increase to |
| 12:00:00 | 0.5000 C | 4.2 | of the first cycle. | 0:05:00 | 0.4875 C | 3.95 | limit, completion |
| | | | | 4:00:00 | 0.5000 C | 4 | of the first cycle. |

In certain embodiments of formation process 200, method 400 may further comprise applying narrowed voltage ranges in the consecutive formation cycles (stage 450). In certain embodiments of formation process 200, method 400 may further comprise adjusting the discharge current ranges in the consecutive formation cycles (stage 460). For example, in the consecutive charge-discharge cycles of the formation process, the battery may be charged and discharged to any value between a specified range of the maximal cell capacity in each of the cycles. Charging and discharging may be carried out to different values with the specified range in different cycles. The specified range may be, e.g., 30%-80%, 20%-80%, 10%-90% or sub-ranges thereof.

Figure 5:
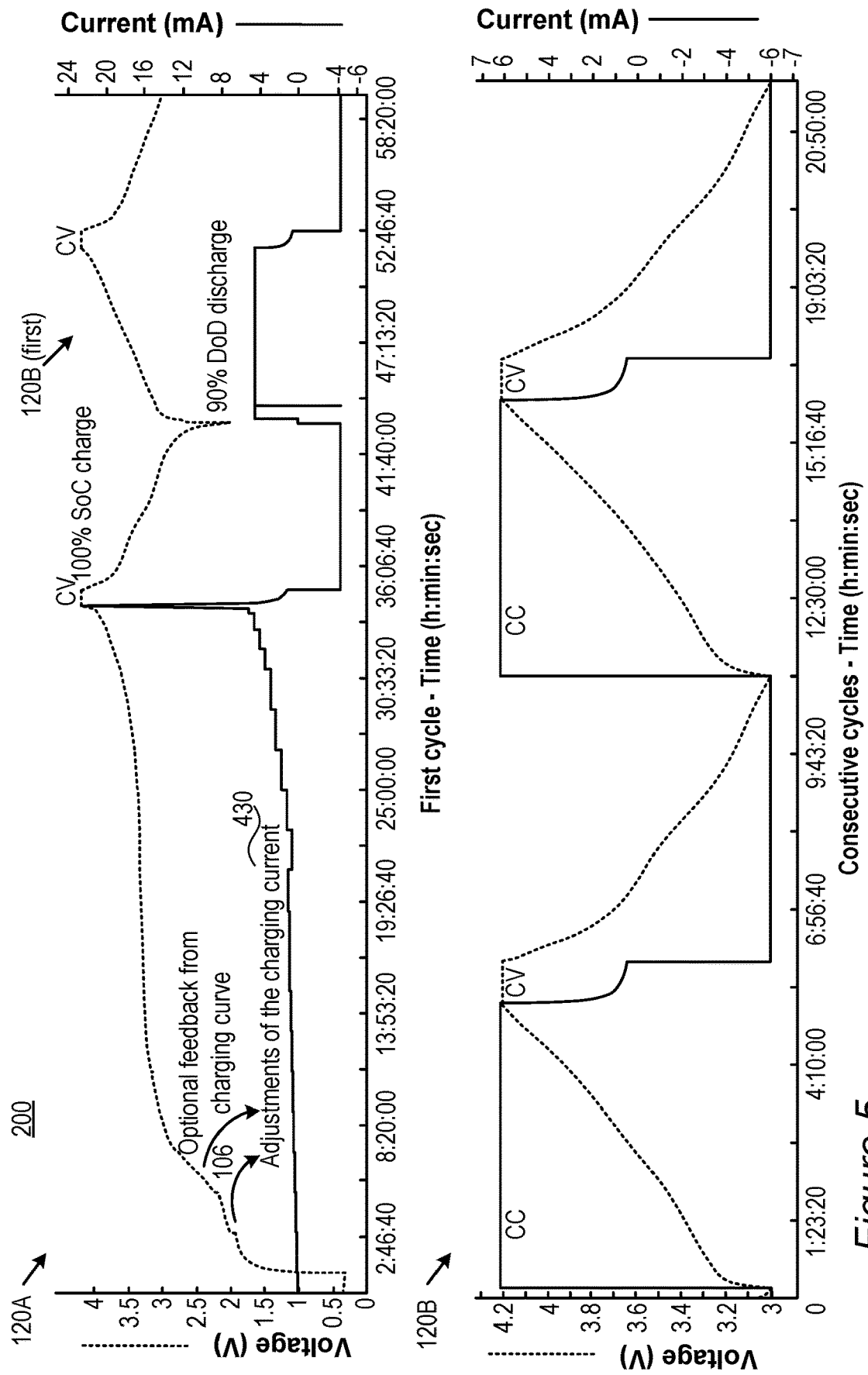

FIG. 5 provides a non-limiting example for formation process 200, according to some embodiments of the invention. In the illustrated non-limiting example, the first formation cycle may be carried out at $C_0/30$ rate to full charge (cycles 120A) with current adjustments (stage 430) according to feedback 106 relating to any of the disclosed characteristics of the cell and its charging parameters, followed by partial discharge, and consecutive cycles may comprise a second cycle at $C_1/10$ (Cycle 120B—first) and two cycles (120B) at $C_2/5$, with $C_1$ denoting the discharge capacity measured or estimated after the first cycle and $C_2$ denoting the discharge capacity measured or estimated after the second cycle. In this example, overall formation time was shortened to 80 hours, while maintaining the lifetime improvement.

The inventors suggest, without being bound by theory, that limiting and/or adjusting the charging currents and/or voltage ranges may prevent parasitic processes at the electrode-electrolyte interfaces which do not contribute to the proper formation of the SEI and may even deteriorate the quality of the SEI (see e.g., Ning and Popov 2004, Cycle Life Modeling of Lithium-Ion Batteries, Journal of the Electrochemical Society, 2004, pages A1584-A1591), later to be manifested in shorter cycling lifetime.

Feedback 106 which may serve to adjust the charging currents or any other of the formation process parameters (see FIG. 1) such as voltage ranges and used currents in charging and/or discharging, as well as current/voltage step durations and other parameters—according to various predetermined criteria and/or measured parameters during the formation process such as time, resistance, capacity, voltages (when currents are pre-determined), currents (when voltages are pre-determined) etc., as well as temporal derivatives of the battery parameters and the formation process parameters.

Figure 6:
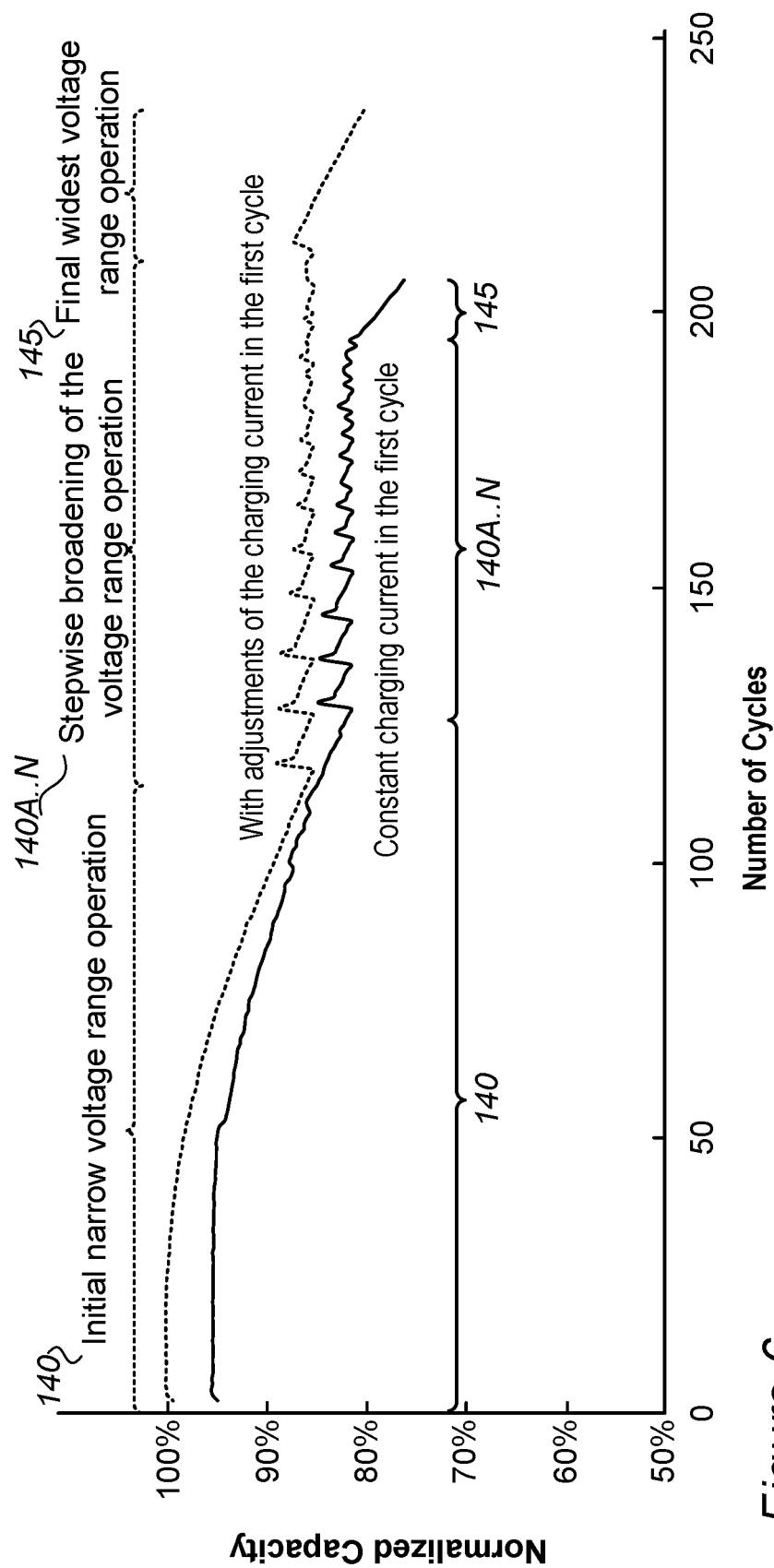
FIG. 6 provides a non-limiting example that illustrates, according to some embodiments of the invention, the additional improvement in cycle lifetime when using current adjustments in the first cycle with respect to using a constant charging current.

FIG. 6 provides a non-limiting example that illustrates, according to some embodiments of the invention, the additional improvement in cycle lifetime when using current adjustments in the first cycle as disclosed above (stage 430, FIG. 5) with respect to using a constant charging current in the first cycle (FIG. 4)—in the non-limiting example cycle life time is improved by ca. 15%. FIG. 6 illustrates the normalized capacity of the cells over their cycling life, under operation conditions of 10 C charging and C/2 discharging, with a dynamic voltage variation cycling procedure described below—the operation voltage range starting at narrow range 140, of 3-4.2V, and is broadened, stepwise 140A . . . N, as the capacity deteriorates, until reaching the widest voltage operation range 145 (see, e.g., FIG. 13).

Figure 7:
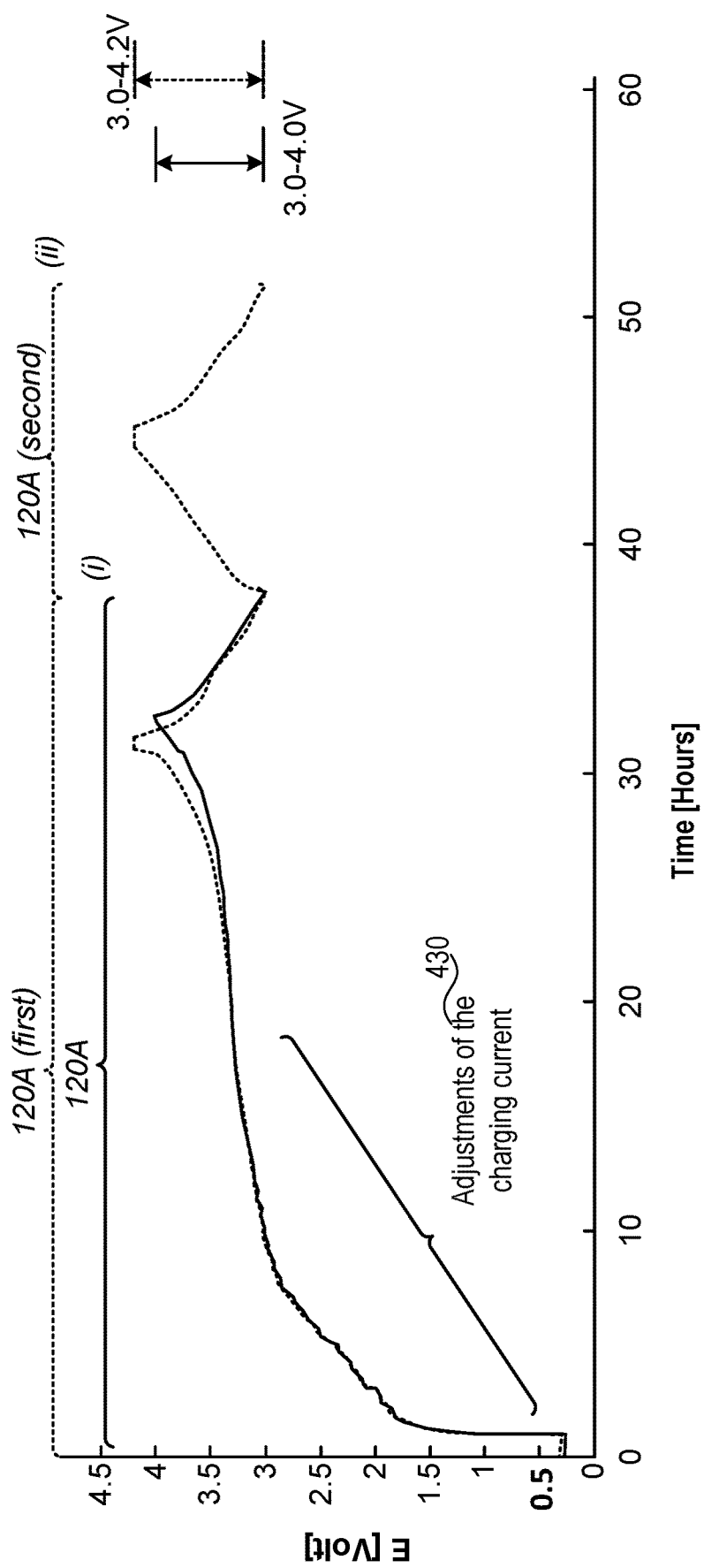
FIG. 7 is a non-limiting example of two formation processes, according to some embodiments of the invention.

FIG. 7 is a non-limiting example of two formation processes 200, according to some embodiments of the invention. Both processes employ current adjustments 430—(i) in one first cycle 120A with voltage range between 3-4V; and (ii) in two first cycles 120A (first) and 120A (second) with voltage range between 3-4.2V. The inventors have found out that process (i) takes 39 hours for the formation process with respect to 51 hours for process (ii), and while process (i) results in a lower capacity of the formed cell by ca. 3-3.5%

(depending on the charging rate) with respect to process (ii), it provides a cycle life time which is longer by ca. 10%—383 hours for process (i) versus 349 hours for process (ii). This non-limiting example illustrates the ability to trade-off cycle lifetime with resulting capacity, which enables the disclosed optimization of the formation process. It is noted that partial discharge in the formation cycles, as disclosed herein (not reaching 100% DoD) further increased the cycle life of the formed batteries. It is emphasized that both variations provide higher cell capacity and longer cycle life, as well as shorter formation duration, with respect to prior art formation processes, and with respect to formation processes such as demonstrated in FIG. 4.

Figure 8:
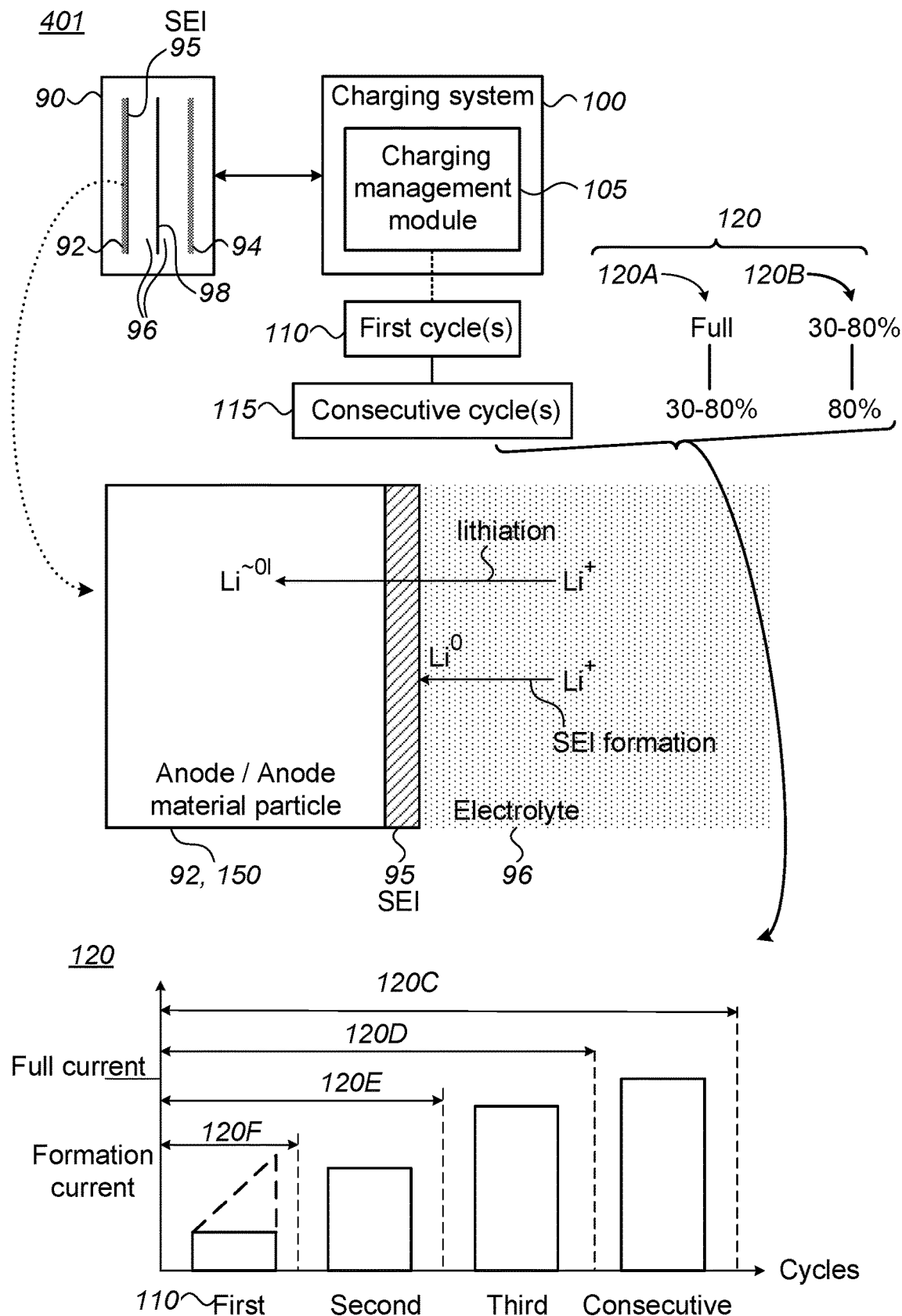
FIG. 8 is a high-level schematic illustration of the fast-charging lithium ion cell, being charged in a SEI formation process, characterized by the cell cycling configurations, according to some embodiments of the invention.

FIG. 8 is a high-level schematic illustration of a fast-charging lithium ion cell 90 being charged in a SEI formation process 401, characterized by cell cycling configurations 120, according to some embodiments of the invention. The inventors have found out that reducing the formation voltage (at a constant voltage phase of charging)—during the first formation charging cycle and/or during consecutive formation charging cycles, may yield efficient formation and increased anode capacity.

FIG. 8 illustrates schematically cell 90 comprising cathode 94, cell separator 98, electrolyte 96 and anode 92 (and/or anode material particles 150, see FIG. 19 below) on which SEI 95 is formed at the interface between anode 92 and electrolyte 95. The SEI formation process is carried out over the first cycles of charging and discharging cell 90 by electrochemical interactions of lithium ions Li$^+$ moving from electrolyte 96 to anode 92, and being reduced on the anode surface, forming the SEI. While most Li$^+$ are intercalated in anode 92 (denoted as Li$^{-01}$, for intercalated lithium atoms), some Li$^+$ are reduced on the anode surface (denoted as Li$^0$), forming the SEI which functions as a barrier during the later operation of cell 90, which prevents or significantly reduce further Li$^+$ reduction and support effective lithiation and release of Li$^+$ with minimal loss of cell capacity. Cell 90 is charged and discharged in the first cycles by a charging system 100 configured to charge and discharge cell 90 during the formation process, which has controller, or a charging management module 105, which determines the charging and discharging ranges in one or more first cycle(s) 110 and consecutive one or more cycles 115. It is noted that the formation processes are carried out at the factory, prior to delivery of the batteries to the end users. While prior art SEI formation process is carried out by fully charging and fully discharging the cell once or more, the inventors suggest, without being bound by theory, that partial charging and/or discharging in at least some of the SEI formation cycles provides better SEI and longer cell operation lifetime. It is noted that the disclosed formation process may be carried out on graphite-based anodes 92 and/or on anodes 92 made of any of other materials, such as metalloids—Si, Ge and/or Sn, as disclosed below (see FIG. 19).

In some embodiments, SEI formation 120 may be carried out by performing first cycle 110 of fully charging cell 90 and consecutively fully or partly discharging cell 90 (e.g., discharging cell 90 from 100%, 90%, 85% or intermediate values, of cell capacity, or DOD—depth of discharge), and consecutively, performing a plurality of charge-discharge cycles 115, in which cell 90 is charged and discharged to between 10-100% of maximal cell capacity in each of cycles 115 (formation scheme 120A). For example, first cycle 110 may be carried out at e.g., 0.1 C, 0.03 C, 0.01 C or values in-between, and consecutive cycles 115 may be carried out at 0.2 C, 0.1 C, 0.05 C, possibly higher values such as 0.5 C or even 1 C, or values in-between. In certain embodiments, first cycle 110 may be carried out at a variable rate, starting e.g., from 0.1 C, 0.03 C, 0.02 C, 0.01 C or values in-between and increasing (e.g., step-wise and/or gradually) during the first cycle to e.g., 0.2 C, 0.3 C, 0.5 C, possibly to higher values such as 1 C or values in-between, until the end of the first cycle.

In some embodiments, SEI formation 120 may be carried out by performing first cycle 110 of charging cell 90 to any value between a specified range of a full cell capacity (e.g., 30%-80%, 20%-80%, 10%-90% or sub-ranges thereof) and consecutively fully or partly discharging cell 90 (e.g., discharging cell 90 from 100%, 90%, 85% or intermediate values, of cell capacity, or DoD), and consecutively, performing a plurality of charge-discharge cycles 115, in which cell 90 is charged 100% of maximal cell capacity and then fully or partly discharged (e.g., discharging cell 90 from 100%, 90%, 85% or intermediate values, of cell capacity, or DoD), in each of cycles 115 (formation scheme 120B). For example, first cycle 110 may be carried out at e.g., 0.1 C, 0.03 C, 0.01 C or values in-between, and consecutive cycles 115 may be carried out at 0.2 C, 0.1 C, 0.05, or values in-between.

FIG. 8 further illustrates fast-charging lithium ion cell 90 being charged in SEI formation process 120, according to some embodiments of the invention, with illustrated embodiments 120C, 120D, 120E, 120F of formation process 120 all use a lower current level than the full current used in prior are formation processes. The inventors have found out that optimizing the formation current (at a phase prior to constant voltage of charging), may yield efficient formation and increased anode capacity.

In certain embodiments, multiple formation cycles may be applied, starting at a low level of current and gradually, from cycle to cycle, increasing the charging current, possibly until reaching the full current in later formation cycles. The following non-limiting examples are shown: formation scheme 120C having more than three cycles (denoted first 110, second 115A, third 115B and consecutive 115 cycles); formation scheme 120D having three cycles (first 110, second 115A and third 115B cycles); formation scheme 120E having two cycles (first 110 and second 115A cycles); and formation scheme 120F having a single cycle (first cycle 110) using a low current (possibly gradually raised current, see, e.g., FIG. 5).

In certain embodiments, formation process 120 may be carried out in a single charging cycle 110 using a reduced level of current. In certain embodiments, charging current level during first cycle 110 may be changed during the formation process (illustrated schematically by the dashed line in scheme 120F), possibly according to measurement of various parameters of cell 90 during formation 120, such as cell resistance, current change and/or derivatives of the voltage-time curve (see e.g., FIG. 5), such as the first and/or second derivative.

In certain embodiments, charging cell 90 in first cycle(s) 110 and/or consecutive cycle(s) 115 is carried out with respect to an estimated amount of charge delivered to and from anode 92 respectively. The inventors have found out that managing the amount of charge moved to and from the anode enables better control of the SEI formation process. In certain embodiments, resulting fast-charging lithium ion cells 90 have improved lifetime due to improved SEI stability and function and possibly improved anode and cell capacity.

Returning to FIG. 3, formation method 200 may comprise the following stages, irrespective of their order. The method stages may be carried out with respect to cells 90 described herein, which may be configured to implement methods 200. Method 200 may be at least partially implemented by at least one computer processor, implemented e.g. in charging management module 105, which controls the charging and discharging of cell 90. Certain embodiments comprise computer program products comprising a computer readable storage medium having computer readable program embodied therewith and configured to carry out relevant stages of method 200. Method 200 may comprise stages for producing, preparing and/or using cell 90, such as any of the following stages.

Method 200 comprises preparing a fast-charging lithium ion cell for use by forming a SEI in the anode (stage 210), for example by performing a first cycle of fully charging the cell and consecutively discharging the cell (stage 220), and performing, consecutively, a plurality of charge-discharge cycles, in which the cell is charged and discharged to between 10-100% of maximal cell capacity in each of the cycles (stage 225).

Alternatively, method 200 may comprise performing a first cycle of charging the cell to between e.g., 30-70% (possibly 30%-80%, 20%-80%, 10%-90% or other ranges) of a full cell capacity and consecutively discharging the cell (stage 230), and performing, consecutively, a plurality of charge-discharge cycles, in which the cell is charged to any of e.g., 70%, 80%, 90% or 100% of the full cell capacity and then discharged, in each cycle (stage 235), in various embodiments, depending on formation plan and requirements.

For example, the first cycle (stages 220 and/or 230) may be carried out at e.g., 0.03 C and the consecutive cycles (stages 225 and/or 235) may be carried out at e.g., 0.1 C. In various embodiments, the first cycle may be carried out at e.g., 0.1 C, 0.03 C, 0.01 C or values in-between, and the consecutive cycles may be carried out at 0.2 C, 0.1 C, 0.05 C, possibly higher values such as 0.5 C or even 1 C, or values in-between. In certain embodiments, the first cycle may be carried out at a variable rate, starting e.g., from 0.1 C, 0.03 C, 0.02 C, 0.01 C or values in-between and increasing (e.g., step-wise and/or gradually) during the first cycle to e.g., 0.2 C, 0.3 C, 0.5 C, possibly to higher values such as 1 C or values in-between, until the end of the first cycle.

In certain embodiments, method 200 may comprise preparing a fast-charging lithium ion cell for use by forming a solid-electrolyte interphase (SEI) in the anode, by performing at least a first cycle of fully charging the cell and consecutively discharging the cell, wherein a first applied charging current in the first cycle is very low e.g., below C/50, C/60, C/70 etc. (stage 250). Certain embodiments comprise gradually increasing the charging current from cycle to cycle (stage 255) and possibly carrying out the formation process in a single low current charging cycle (stage 260).

Returning to FIG. 2, methods 400 may comprise operating the battery 300 initially at a narrow range of voltages (stage 470), e.g., which is smaller than 1.5V and consecutively, upon detection of a specified deterioration in a capacity of the battery, operating the battery at least at one broader range of voltages, e.g., which is larger than 1.5V (stage 480). For example, the narrow range may be within 3-4V and at least one of the broader range(s) may be within 1.8-4.95V. In another example, the narrow range may be within 3.1-4.3V and at least one of the broader range(s) may be within 1.8-4.3V. The at least one broader range may comprise a plurality of consecutive steps of increasing voltage ranges (denoted 140A . . . N), between the narrow range (denoted 140) and a full operation range of the battery (denoted 145). For example, narrow range 140 may be within 3.1-4.3V, the consecutive ranges 140A . . . 140C may be within 3.0-4.3V, 2.8-4.3V, and 2.5-4.3V; and the full range 145 may be within 1.8-4.3V.

In certain embodiments, operating the battery 300 may be carried out at rates calculated with respect to the discharge capacity measured or estimated after the last of the consecutive formation cycles (denoted $C_2$), see Equations 1 above, e.g., at 10 $C_2$ (charging) and $C_2/2$ (discharging), possibly after adjustments (stage 427) carried out during formation process 200. Moreover, during the operation of the battery 300, method 400 may further comprise adjusting charging currents according to estimations of a deteriorating capacity of the battery (stage 490). In certain embodiments, during the operation of the battery 300, method 400 may further comprise ramping up gradually the charging currents during a first third of a charging duration of the battery (stage 492) and possibly adjusting the charging current ramping according to estimations of the deteriorating capacity of the battery (stage 495), see FIG. 17 below for an example for current ramping.

Figure 9:
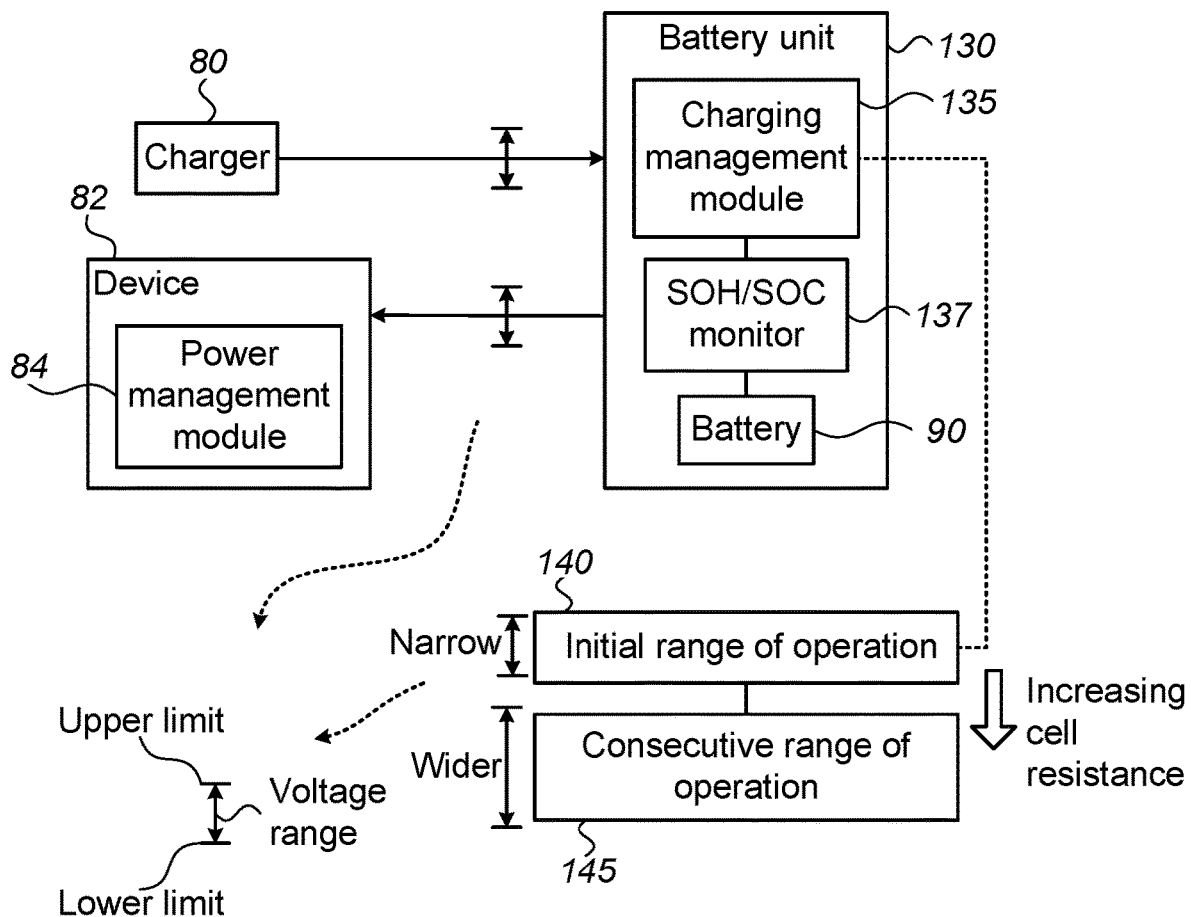
FIGS. 9-11 are high-level schematic illustrations of operating a fast-charging lithium ion battery, according to some embodiments of the invention.
Figure 10:
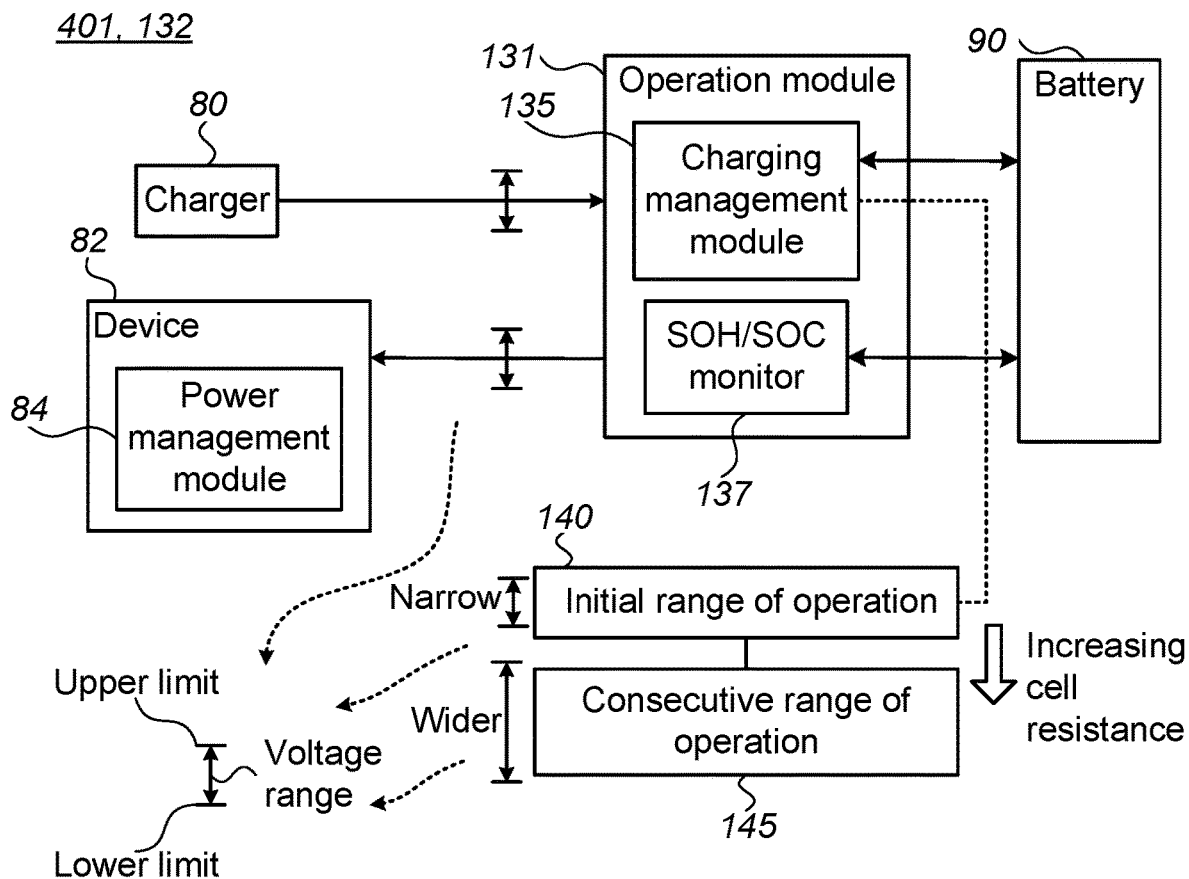
Figure 11:
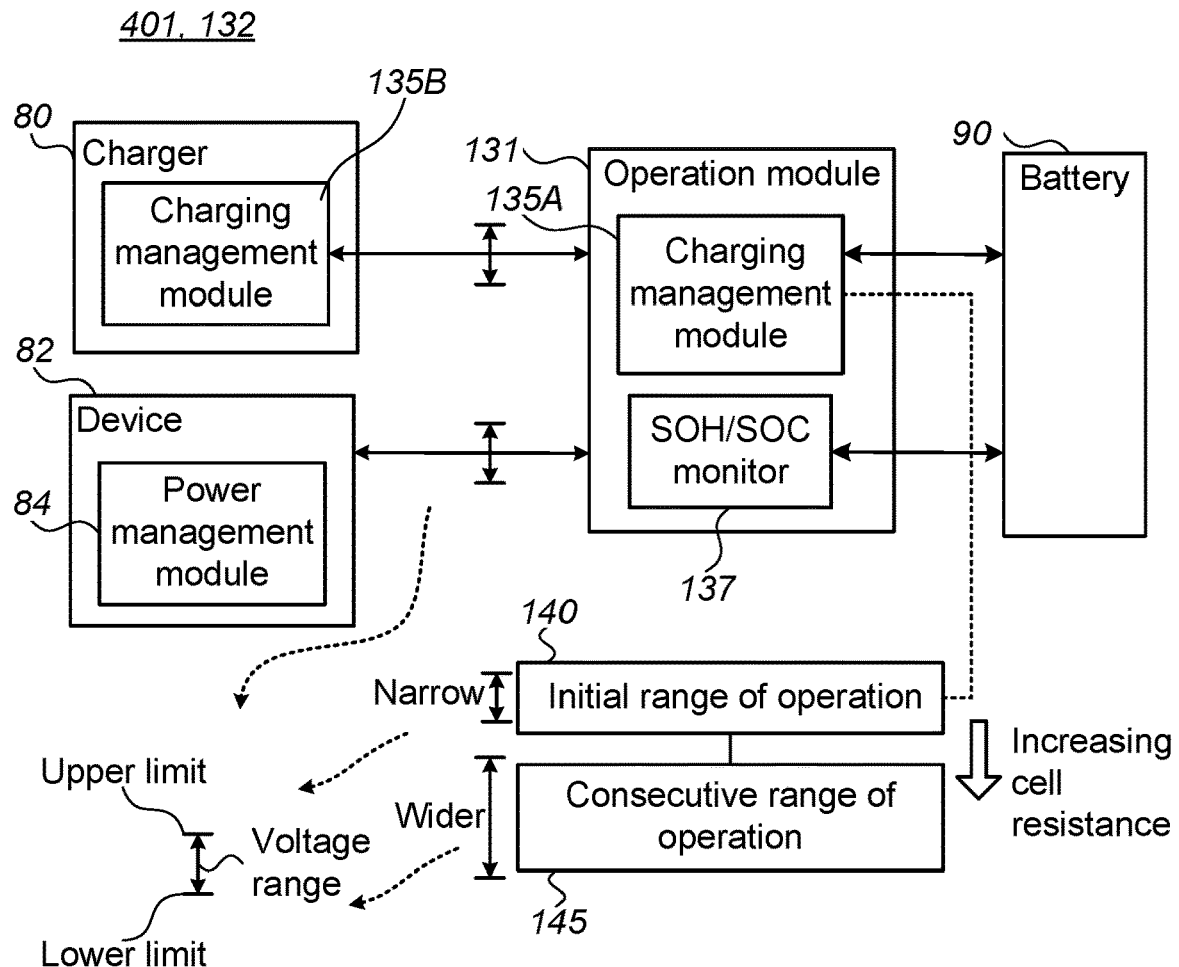

FIGS. 9-11 are high-level schematic illustrations of systems 132 operating a fast-charging lithium ion battery 90 in gradually increasing voltage ranges, according to some embodiments of the invention. Systems 132 may be at least part of systems 401 configured to increase the cycling lifetime of fast charging lithium ion batteries 90. Battery units 130 comprise battery 90 (e.g., as one or more packs or cells) and typically comprise and/or are associated with a charging management module 135 configured to determine various battery operation parameters (FIG. 9), including the voltages range of operation in supplying power to devices 82 connected to battery unit 130. Battery unit 130 may further comprise and/or be associated with a SOH (state of health) and/or SOC (state of charge) monitor 137 which monitors battery performance parameters such as resistance and capacitance thereof. In various configurations of systems 132, at least one fast-charging lithium ion battery 90 may be operatively associated with one (or more) battery management unit(s) 135 configured to modify a range of voltage levels supplied by or to battery unit(s) 130 according to a state of health of the battery, any of battery parameters (e.g., resistance, estimated capacity, state of charge, etc.) starting from an initial narrow range and reaching a full voltage range (e.g., narrow range spanning less than 1.5V and the full range spanning more than 2V), as exemplified below. In certain embodiments, the initial narrow range may be any of 30%, 50%, 70% or any intermediate value of the full operative range of the battery.

In some embodiments, charging management module 135 and/or SOH/SOC monitor 137 may be part of an operating module 131 (illustrated schematically in FIG. 10) which may be a unit external to battery unit 130 and in communication thereto and/or contact therewith. Either or both charging management module 135 and SOH/SOC monitor 137 may be packed separately from fast-charging lithium ion battery 90, e.g. as operating module 131.

In some embodiments, charging management module 135 (or 135A) and/or SOH/SOC monitor 137 may be part of an operating module 131 (illustrated schematically in FIGS. 10 and 11) which may be in bi-directional communication with charger 80 and/or with device 82. In certain embodiments (see e.g., FIG. 11), at least part of the charging management may be carried out by a charging management module 135B in charger 80 which may be configured to complement or replace a charging management module 135A in operation module 131 (or in battery unit 130 as illustrated schematically in FIG. 9). Communication between charging management module 135B in charger 80 and charging management module 135A in operation module 131 and/or charging management module 135 in battery unit 130 may be bi-directional.

Charging management module 135 may be in communication with a power management module 84 in device 82 to coordinate parameters of the supplied power and ensure proper operation of device 82 at the set voltages ranges.

Battery units 130 may be configured, typically by configuring charging management module 135, to modify a range of voltage levels supported by battery unit 130 according to a state of battery 90, starting from an initial narrow range of operation 140 and reaching a consecutive wider range of operation 145 as the battery's cell resistance increases. The voltages range modification may be carried out with respect to an estimated resistance of battery 90 and to maximize a capacity of battery 90, e.g., according to data from SOH/SOC monitor 137. For example, modifying the voltage range may be implemented by increasing a charging voltage upper limit and/or by decreasing a discharging voltage lower limit. In some embodiments, narrow range 140 may be between 3-4V and the wider range 145 may be between 1.8-4.95V.

In certain embodiments, battery management unit 135 may be configured to modify the voltage range in a plurality of consecutive steps of increasing voltage ranges, between initial narrow range 140 and full range 145.

In certain embodiments, a width of narrow range 140 may be around 1V, e.g., 2.8-3.8V, 3-4V, 3.2-4.2V, possibly also smaller such as 0.8V, e.g., 2.8-3.6V, 3-3.8V, 3.2-4V, possibly also larger such as 1.2V, e.g., 2.8-4V, 3-4.2V.

In certain embodiments, a width of narrow range 140 may be around 3V, e.g., 1.8-4.8V, 2-5V, possibly also smaller such as 2.5V, e.g., 1.8-4.3V, 2-4.5V, 2.2-4.7V, possibly also larger such as 3.2V, e.g., 1.6-4.8V, 1.8-5V.

Advantageously, without being bound by theory, as fast charging batteries 90 have low resistance, they enable the widening of the voltage range (from narrow range 140 to wider range 145) to increase their capacity with respect to the prior art.

Charging battery 130 by a corresponding charger 80 may be carried out in corresponding narrow and wider ranges in different operation stages of battery, which may be similar to narrow and wider ranges 140, 145 that are used during discharging battery 90 to operate device 82.

Certain embodiments comprise fast-charging lithium ion battery units 130 comprising one or more corresponding battery management units 135 configured to modify a range of voltage levels supplied by battery 90 according to a state of health of the battery, starting from a narrow range and reaching a wider range.

Returning to FIG. 3, operation method 300 may comprise the following stages, irrespective of their order. The method stages may be carried out with respect to batteries 90 and/or battery units 130 described herein, which may be configured to implement methods 300. Method 300 may be at least partially implemented by at least one computer processor, implemented e.g. in charging management module 135, which controls the energy supply by battery unit 130 to device 82. Certain embodiments comprise computer program products comprising a computer readable storage medium having computer readable program embodied therewith and configured to carry out relevant stages of method 300. Method 300 may comprise stages for producing, preparing and/or using batteries 90 and/or battery unit(s) 130, such as any of the following stages, irrespective of their order.

Method 300 comprises operating a device, using a fast-charging lithium ion battery, by managing operation voltages of the battery to increase its lifetime (stage 305), for example by modifying a range of voltage levels supplied by the battery according to a state of the battery (stage 310), starting from a narrow range and reaching a wider (possibly a full) range (stage 330).

In certain embodiments, method 300 may further comprise modifying a range of voltage levels at which the battery is charged according to a state of the battery (stage 315), with respect to any of a plurality of battery parameters such as resistance, state of charge, capacity etc. Modifying 310 (and optionally 315) the range(s) may be carried out with respect to, and to minimize the remaining capacity of the battery (stage 317) and/or to minimize a capacity fade of the battery. The voltage range may be modified out in a plurality of consecutive steps of increasing voltage ranges (stage 318), between the initial narrow range and the full range, starting e.g., from an initial narrow range which is any of 30%, 50%, 70% or any intermediate value of the full operative range of the battery (stage 319).

Method 300 may further comprise monitoring the state of charge and/or state of health of the battery to determine the operation ranges (stage 320), and carry out modifications 310 (and optionally 315) accordingly.

Modifying 310 (and optionally 315) may be carried out with respect to an estimated resistance of the battery and to maximize a capacity of the battery.

Modifying 310 (and optionally 315) may be implemented by increasing a charging voltage upper limit (stage 332) and/or by decreasing a discharging voltage lower limit (stage 334).

In some embodiments, the narrow range is 3-4V and the wider range may be 1.8-4.95V. In some embodiments, the narrow range is any of 3.1-4.3V, 3.0-4.3V, 2.8-4.3V, and 2.5-4.3V; and the full range may be 1.8-4.3V.

In certain embodiments, method 300 further comprises reducing the charging current as the cell capacity decreases (stage 340) and/or increasing the duration of the constant current charging phase as the cell performance deteriorates (stage 350).

In certain embodiments, method 300 further comprises introducing, intermittently, sets of few (e.g., 1-10) full voltage range cycles configured to redistribute lithium ions in anode material particles of the battery (stage 360), as explained below (see FIG. 20C).

Figure 12:
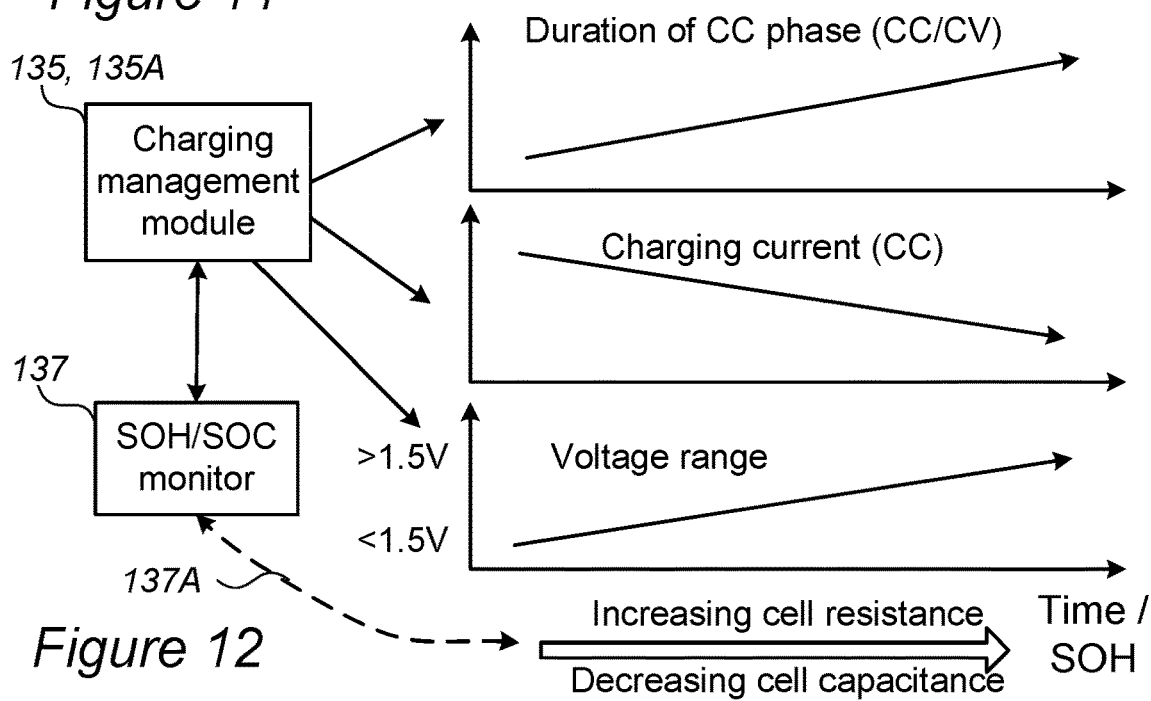
FIG. 12 is a high-level schematic illustration of controlling the parameters for operating a fast-charging lithium ion battery unit or battery in multiple voltage ranges, according to some embodiments of the invention.

FIG. 12 is a high-level schematic illustration of controlling the parameters for operating a fast-charging lithium ion battery unit 130 or battery 90 in multiple voltage ranges 140, according to some embodiments of the invention. As the cell resistance increases and the cell capacitance decreases, any of the following operation parameters may be changed accordingly: The operation voltage range may be modified as disclosed herein, e.g., extended from voltage range(s) which extend over less than 1.5V to voltage range(s) which extend over more than 1.5V; from high charging current to lower charging currents, either at C-rates which correspond to the deteriorating battery capacity or according to pre-defined parameters; and/or from shorter durations of the constant current stage with respect to the constant voltage stage (CC/CV) to longer durations of the constant current stage with respect to the constant voltage stage (see e.g., FIG. 16B). In certain embodiments, the operation voltage range may be modified with respect to the battery's DC (direct current) resistance value which may be monitored occasionally (e.g., after any predefined number of cycles), and used to define threshold(s) for triggering the change of voltage range and/or the change of charging current (and see below).

The control of the illustrated operation parameters may be carried out by charging management module 135, 135A, possibly as specified operation schemes, and possibly incorporating monitoring and/or feedback 137A by SOH/SOC monitor 137. Any of the elements of the illustrated schemes may be applied independently or in combination with other elements, and by any of the embodiments of charging management module 135, 135A. Based on data from SOH/SOC monitor 137 and/or independently therefrom, charging management module 135, 135A may be configured to control any of the following parameters as cell resistance increases, cell capacitance decreases and/or time passes: The voltage range may be gradually increased and/or the charging current (in the constant current, CC, phase of charging) may be decreased (e.g., as cell capacitance decreases). Any of these changes may be carried out gradually and/or stepwise. It is noted that while these parameters are related and partly dependent on each other, operation optimization may be configured to control one or more of these parameters, indirectly determining the other parameters as well. See, e.g., FIGS. 16A-C for non-limiting examples.

Figure 13:
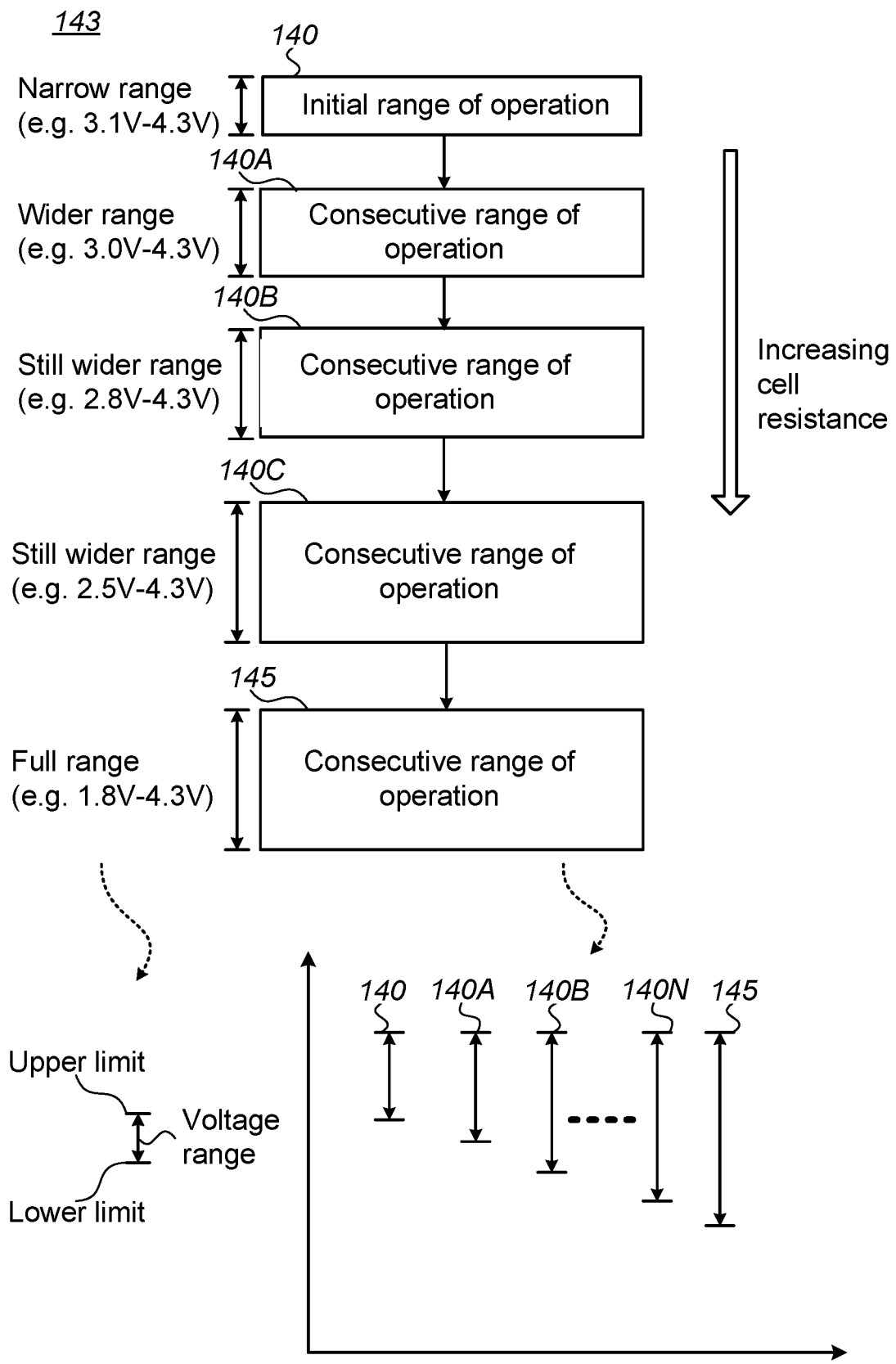
FIG. 13 is a high-level schematic illustration of operating a fast-charging lithium ion battery unit or battery in multiple voltage ranges, according to some embodiments of the invention.

FIG. 13 is a high-level schematic illustration of operating a fast-charging lithium ion battery unit 130 or battery 90 in multiple voltage ranges 140, according to some embodiments of the invention. Any of disclosed charging management modules 135 may be configured to operate battery unit 130 or battery 90 in a variety of voltage ranges (cumulatively included in an operation pattern 143), having continuously or step-wise changing lower limits and possibly upper limits. For example, FIG. 13 exemplifies stepwise increases in the extent of the operation voltage range, which are related to the increasing cell resistance. In the illustrated non-limiting examples, voltage ranges of 3.1-4.3V as initial narrow range of operation 140, 3.0-4.3V as a wider range of operation 140A, 2.8-4.3V as a still wider range of operation 140B, 2.5-4.3V as a still wider range of operation 140C, and 1.8-4.3V as full range of operation 145, as the cell resistance exceeds a specified threshold. FIG. 13 further illustrates schematically the operation of battery unit 130 with N intermediate and sequentially increasing voltage ranges (140A, 140B, . . . , 140N) between initial narrow range and full range 145. Changes from each voltage range to the next may be applied with respect to various parameters, such as time, SOH, SOC, cell capacity, cell resistance, etc.

Figure 14A:
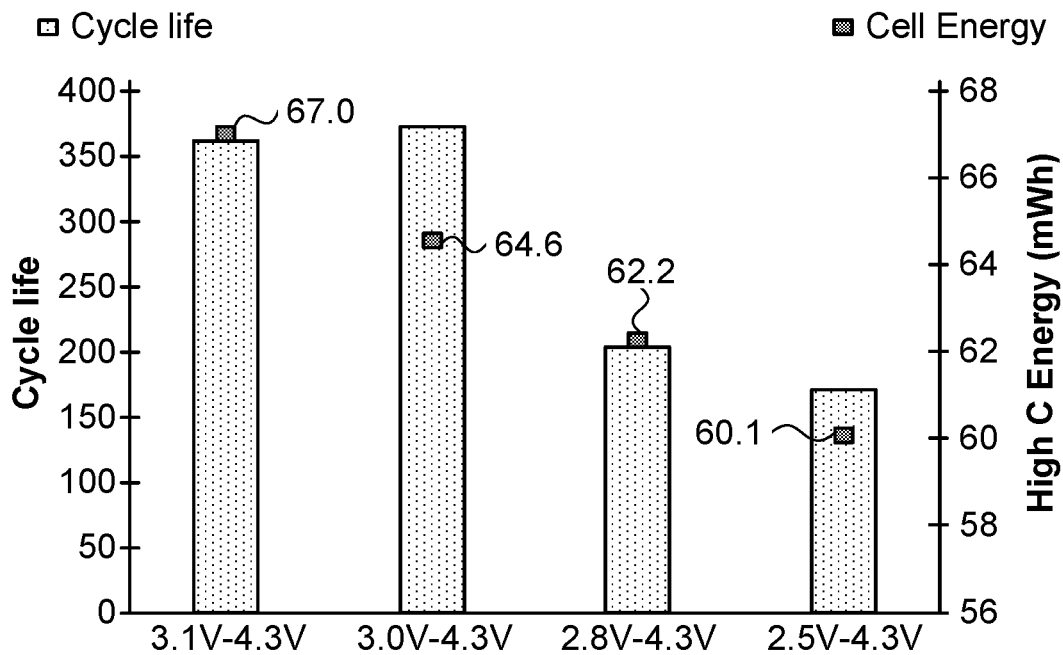
FIGS. 14A and 14B demonstrate results that indicate the improved performance of fast charging batteries when operated according to the disclosed scheme, according to some embodiments of the invention.
Figure 14B:
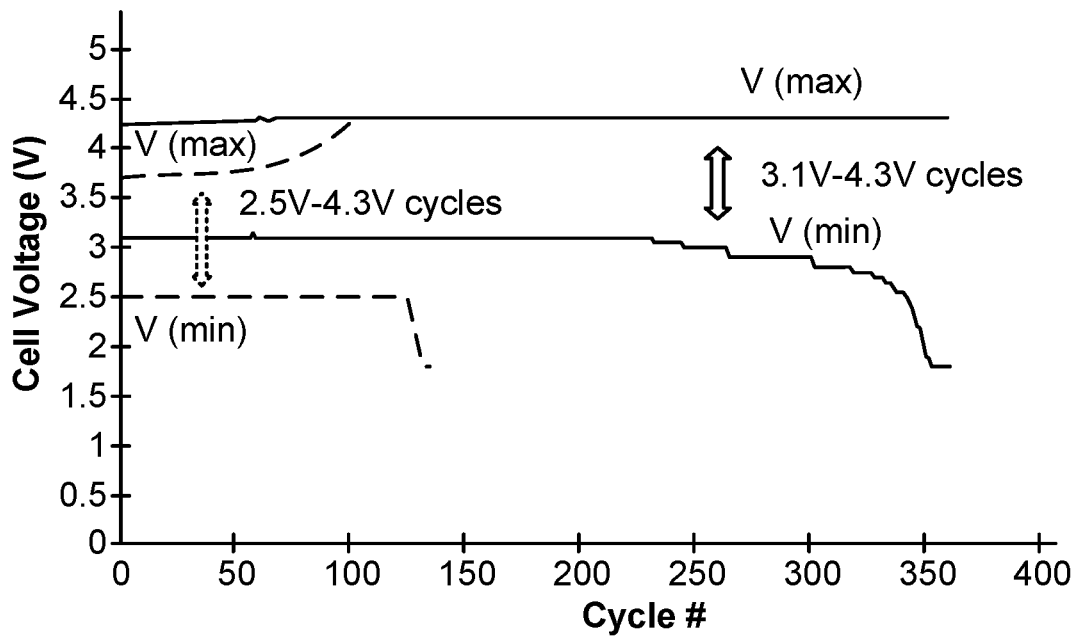

FIGS. 14A and 14B demonstrate results that indicate the improved performance of fast charging battery unit(s) 130 when operated according to the disclosed scheme, according to some embodiments of the invention. FIG. 14A illustrates the cycle life (number of cycles) and energy (mWh) of cells operated at 10 C charging rate at four different initial voltage ranges 140, namely of 3.1-4.3V, 3.0-4.3V, 2.8-4.3V and 2.5-4.3V throughout the operation of the cell. In all four cases, the operation voltage range was gradually increased from respective initial voltage ranges 140 until full range 145 1.8-4.3V was reached. As illustrated in FIG. 14A, operation of the cell at initial narrow voltages ranges 140 smaller than 1.5V increases the cycle life twofold to threefold with respect to cell operation with full voltage range 145 from the beginning of the cycling (e.g., for an initial voltage operation range of 1.2V cycle life was more than doubled with respect to an initial voltage operation range of 1.8V). Moreover, the narrower the initial operation range is, the higher is the achieved cell energy. It is noted also, that the narrower the initial operation range is, the larger is the flexibility in consequent operation of the cell with respect to the voltage range. FIG. 14B illustrates the cycle life of two of the four operation schemes in more detail, illustrating the long life cycle achieved by initial narrow voltages 140 ranges smaller than 1.5V (shown for 3.1V-4.3V cycles, with the maximal and minimal cut off voltage levels illustrated in solid lines)—providing long cycle life of the cells, ca. 300 cycles in the illustrated, non-limiting example, with respect to prior art initially broad voltage range (shown for 2.5V-4.3V, with the maximal and minimal cut off voltage levels illustrated in broken lines)—providing short cycle life of the cells, ca. 100 cycles.

Figure 15:
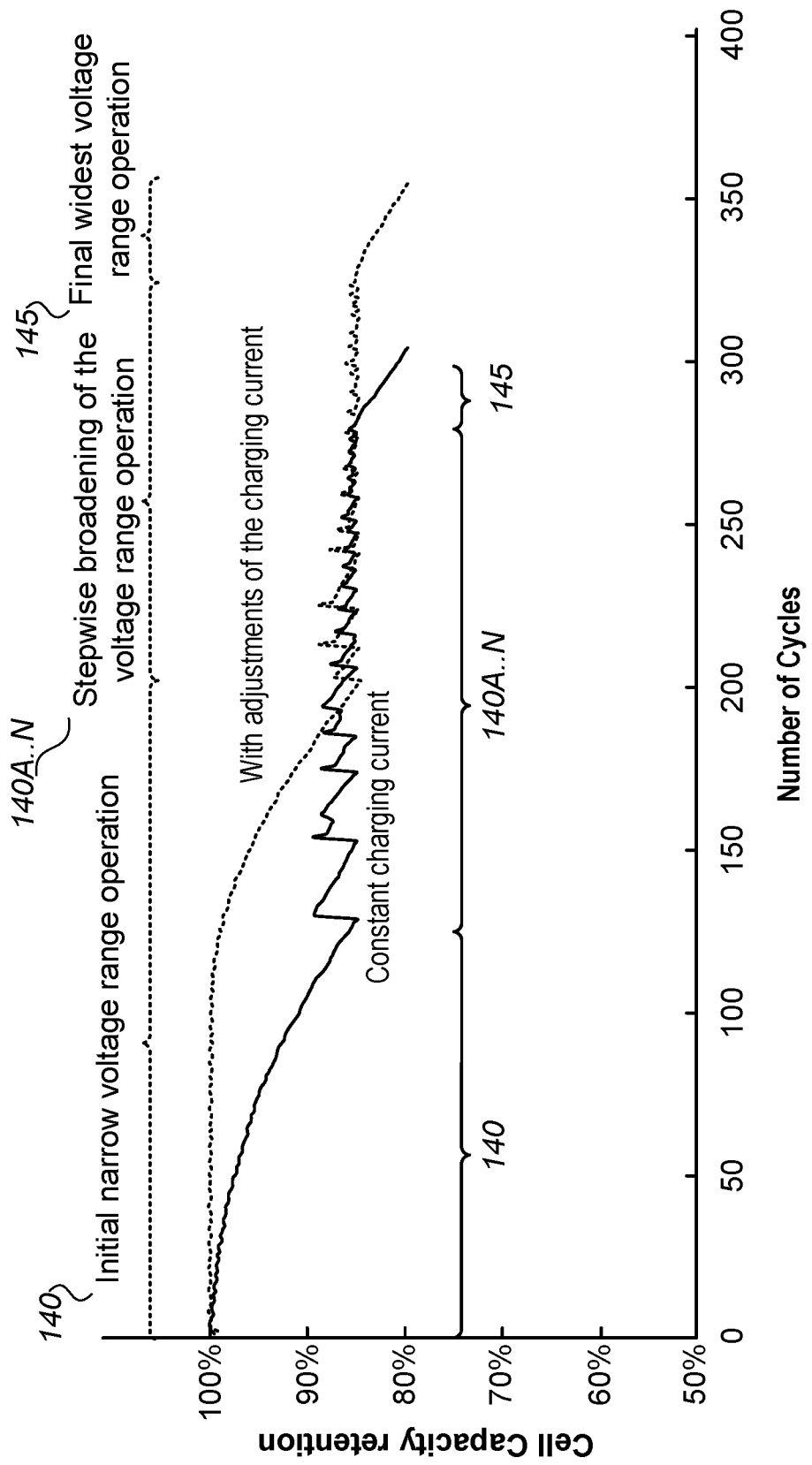
FIG. 15 provides a non-limiting example for the increased cycle lifetime of the battery operated with adjusted charging currents according to the deteriorating capacity of the battery, according to some embodiments of the invention.

FIG. 15 provides a non-limiting example for the increased cycle lifetime of battery 90 operated with adjusted charging currents according to the deteriorating capacity of battery 90 (stage 490), according to some embodiments of the invention. FIG. 15 illustrates a comparison of cell capacity retention of 1 Ah cells over their cycling life, under operation conditions of 10 C charging and C/2 discharging with current adjustments that correspond to the declining cell capacity (see, e.g., FIG. 16A below) in addition to the dynamic voltage variation cycling procedure described above—the operation voltage range starting at narrow range 140, of 3-4.2V, and is broadened, stepwise 140A . . . N, as the capacity deteriorates, until reaching the widest voltage operation range 145.

Figure 16A:
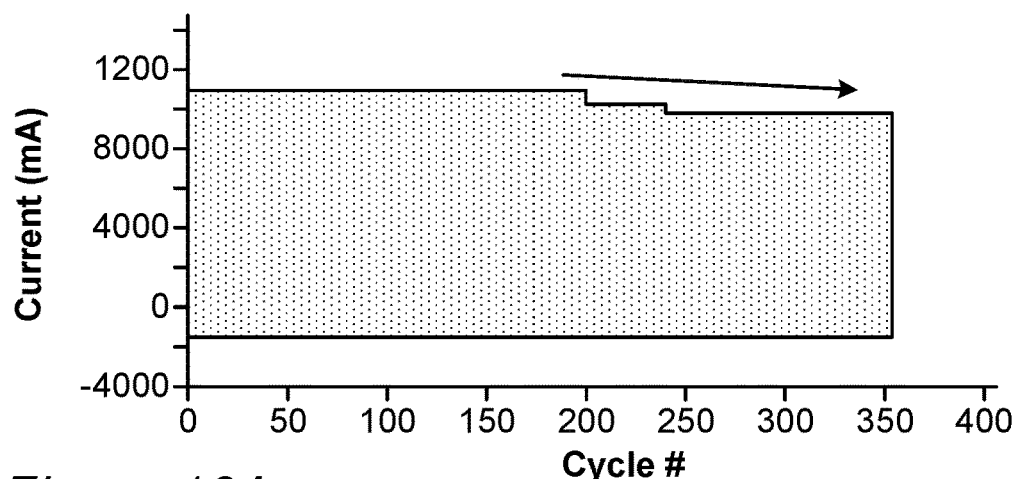
FIGS. 16A-C provide examples for current adjustments corresponding to cell deterioration, according to some embodiments of the invention.
Figure 16B:
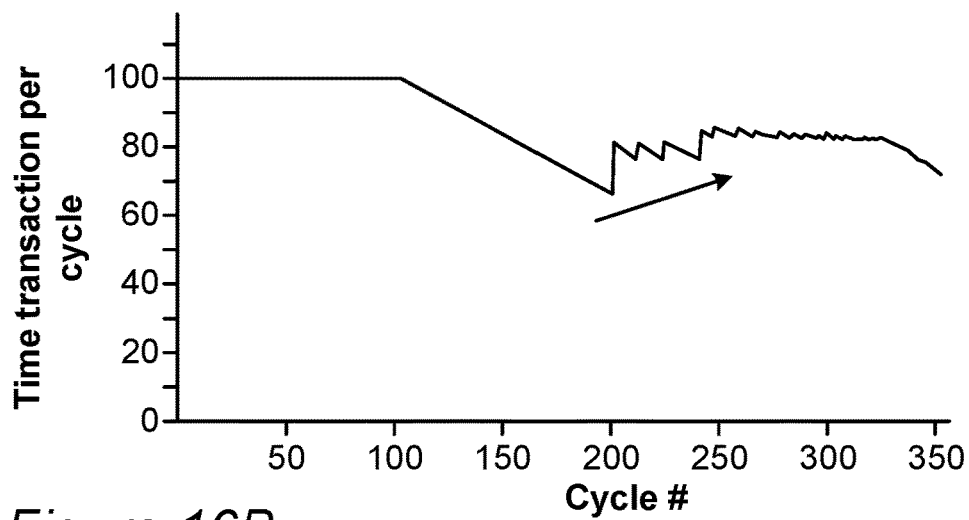
Figure 16C:
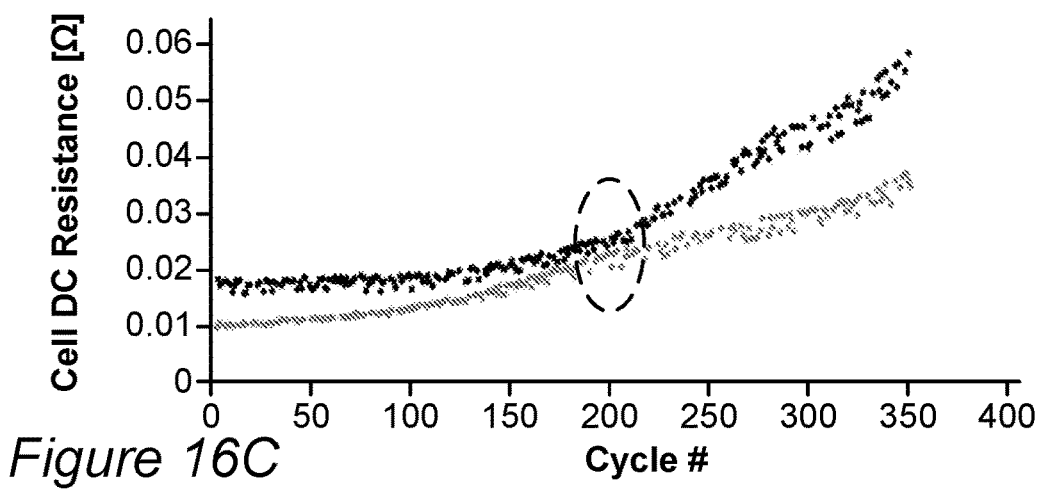

FIGS. 16A-C provide examples for current adjustments corresponding to cell deterioration 490, according to some embodiments of the invention. FIG. 16A-16C refer to the same operation pattern of the battery, illustrated with respect to the maximal and minimal charging currents (FIG. 16A), ratio of constant current (CC) stage to total cycle duration (FIG. 16B) and cell DC resistance during charging and discharging (FIG. 16C).

FIG. 16A provides a non-limiting example for the maximal and minimal cycling currents and their adjustment with capacity degradation during increasing cycle numbers, according to some embodiments of the invention. In the illustrated example, the maximal current is reduced stepwise after the 200$^{th}$ cycle (indicated by the arrow), at three steps of decrease: 11 A, 10.3 A, 9.9 A. The current adjustments may be determined in dependency on the cell degradation, e.g., using a new current value which equals the cell capacity decrease (the ratio of capacity at specific cycle to the initial cell capacity value) times the initial maximal current (used to charge the cell at the beginning of the cycle life) optionally times a multiplication factor (e.g., between 0.85 and 1.2). For example, if the initial charging current is 10 A and the cell capacity decrease is 85%, then the adjusted charging current may be decreased to 8.5 A (assuming 1 as multiplication factor).

FIG. 16B provides a non-limiting example for the duration of the CC stage from the total cycle duration during increasing cycle numbers, according to some embodiments of the invention. The decreased duration of the CC stage during cycles 100 to 200 may be increased by the current adjustments starting in cycle 200, indicating that decreasing the charging current actually helps in maintaining the charge more in the CC mode. In certain embodiments, the charging current may be changed to values that equal the initial maximal current times the ratio between CC and total charging times, optionally times a multiplication factor (e.g., between 0.85 and 1.2). For example, if the initial charging current is 10 A and the percentage of CC stage from total cycle is 80%, then the adjusted charging current may be decreased to 8 A (assuming 1 as multiplication factor) to approach full cycling at constant current (CC).

FIG. 16C provides a non-limiting example for the increase in cell DC resistance to charging and to discharging, during increasing cycle numbers, according to some embodiments of the invention. Threshold value(s) may be set along the increasing resistance curves, for triggering any of current decrease, voltage range increase and their magnitudes. For example, the adjusted current value may be set to equal the initial maximal current times the ratio between and initial and later DC resistance values, optionally times a multiplication factor (e.g., between 0.85 and 1.2). For example, if the initial charging current is 10 A and the DC resistance values ratio is 0.72, then the adjusted charging current may be decreased to 7.2 A (assuming 1 as multiplication factor).

Certain embodiments may combine the considerations presented above and control the charging current adjustments according to any combination of the cell capacity, the duration of the CC stage, the DC resistance and possibly of related characteristics.

Figure 17:
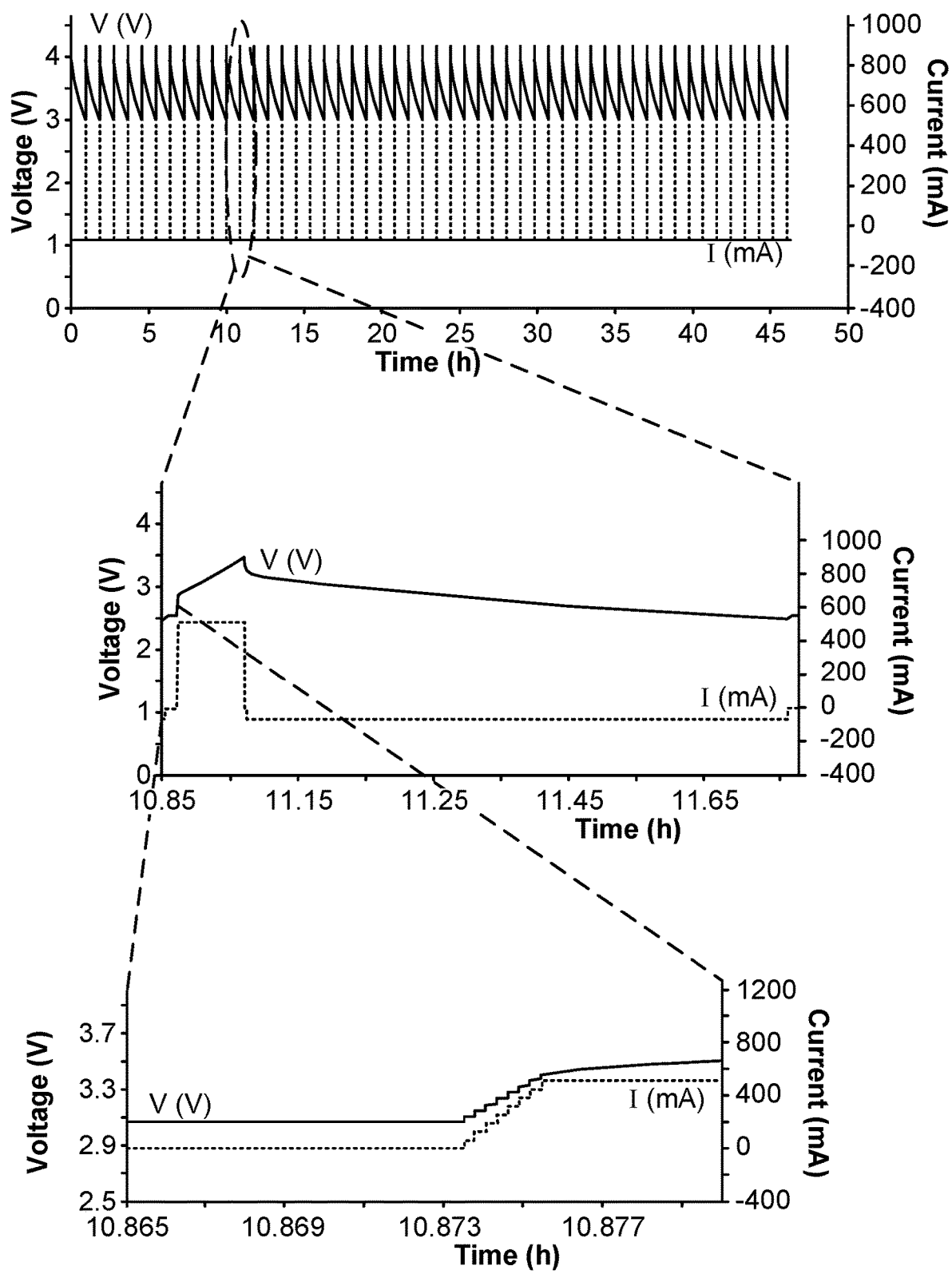
FIG. 17 provides a non-limiting example for current ramping at the beginning of charging during battery operation, according to some embodiments of the invention.

FIG. 17 provides a non-limiting example for current ramping (see e.g., stage 492, 495) at the beginning of charging during battery operation, according to some embodiments of the invention. The inventors have found out that current ramping may decrease the probability of dendrite formation and lithium concentration differences, which may lead to battery failure. Particularly when using high currents applied in fast and ultra-fast charging, there is a need to overcome potential threats as lithium dendrite formation on the anode side, which could cause in turn further dendrite growth, separator penetration, and eventually short circuit of the cell. In addition, while applying high current densities, on the electrode/electrolyte interface, there could be very large differences in lithium ion concentrations at the electrode/electrolyte interface, resulting in areas with lithium ion deficiency and areas with elevated lithium ion concentration—which may cause local rise in resistance and local heating, enhancing electrolyte decomposition on both the anode and the cathode.

Charging currents may be initially ramped up, gradually increased, to prevent dendrite formation and lithium concentration differences. Various forms of current ramping may be applied and optimized, such as linear ramping ($I=aT+b$), quadratic ramping ($I=aT^2+bT+c$), or any other polynomial ramping (e.g., $I=aT^3+bT^2+cT+d$), or other increasing functional forms (e.g., $I=a \cdot \sin(bT)$), in all of which I denoting the current value, T the time and a to d are coefficients. Clearly, ramping may be carried out stepwise from zero to a specified value, possibly with intermissions between steps, as presented in a non-limiting example in Table 3, with t1-t13 indicating consecutive time points between zero and full charging.

TABLE 3 a non-limiting example for a current ramping procedure during battery operation.

| Time unit | C-rate range |
| --- | --- |
| t1 | 0.1 C-0.99 C |
| t2 | 1 C-1.99 C |
| t3 | 2 C-2.99 C |
| t4 | 3 C-3.99 C |
| t5 | 4 C-4.99 C |
| t6 | 5 C-5.99 C |
| t7 | 6 C-6.99 C |

TABLE 3-continued a non-limiting example for a current ramping procedure during battery operation.

| Time unit | C-rate range |
| --- | --- |
| t8 | 7 C-7.99 C |
| t9 | 8-8.99 C |
| t10 | 9-9.99 C |
| t11 | 10 C-11.99 C |
| t12 | 12 C-14.99 C |
| t13 | 15 C-20 C |

For example, FIG. 17 illustrates, in three consecutive graphs, a full view of voltage and current vs. time during operation, a single charge-discharge cycle therefrom, and current ramping in the cycle. In the non-limiting example, current ramping was performed in a step-wise mode with additions of 1 C current each second, up to current of 8 C at the end.

Figure 18A:
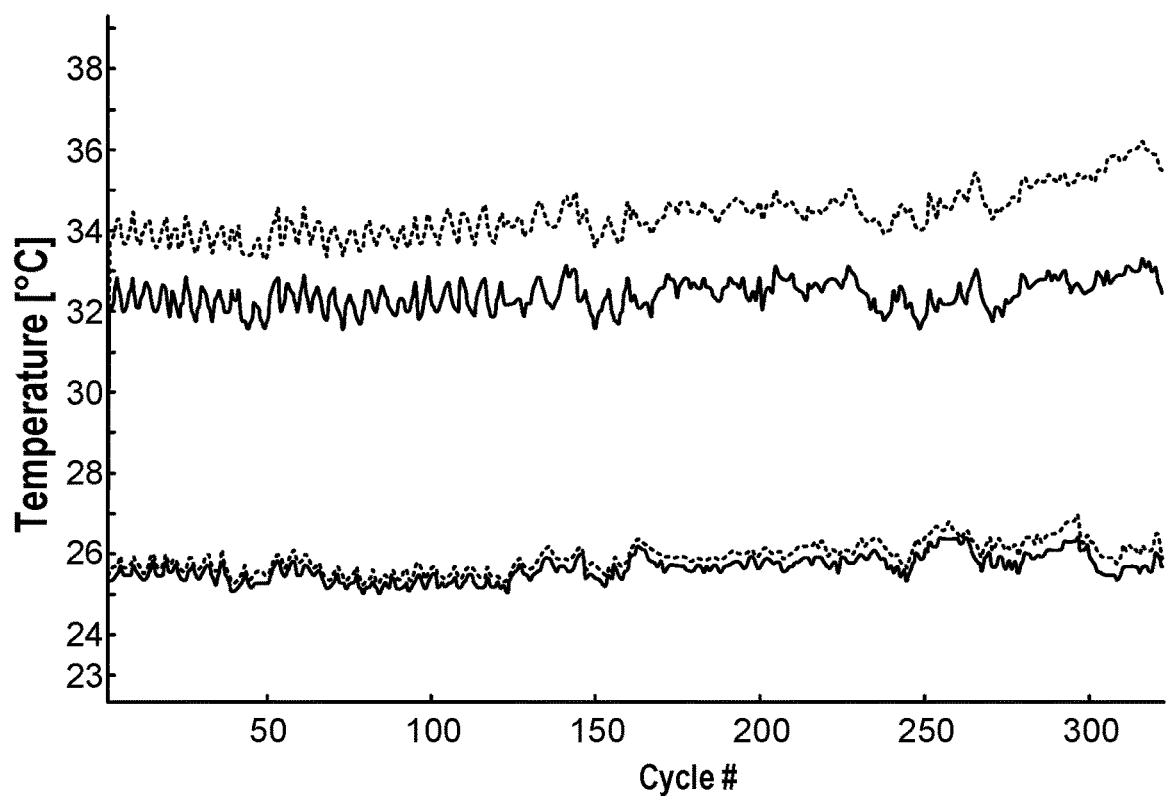
FIG. 18A illustrates the cell temperature during cycling with current adjustments, according to some embodiments of the invention, compared to FIG. 18B illustrating the cell temperature during cycling with constant values for the charging currents.
Figure 18B:
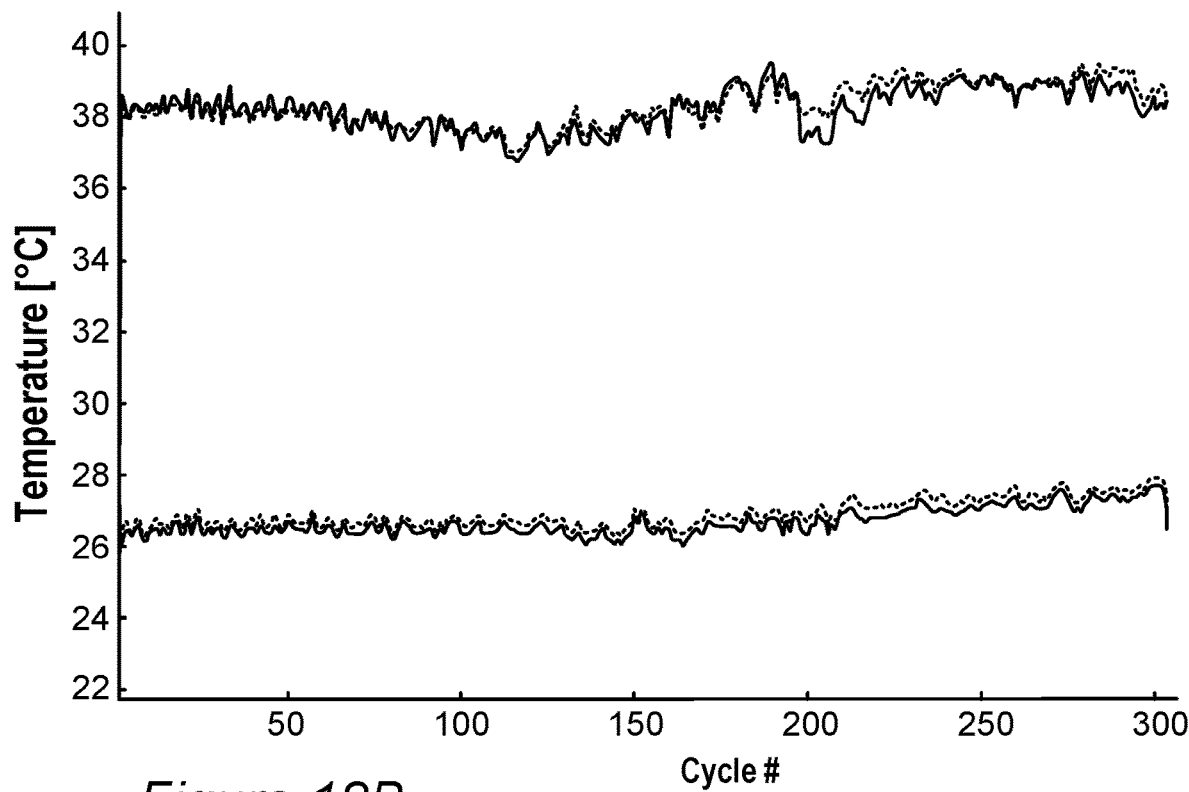

FIG. 18A illustrates the cell temperature during cycling (operation of battery 90) with current adjustments corresponding to cell deterioration 490, according to some embodiments of the invention, compared to FIG. 18B illustrating the cell temperature during cycling (operation of battery 90) with constant values for the charging currents (with dynamic voltage range). Illustrated are the minimal temperatures (at the end of discharging in each cycle, bottom two lines in each graph) in two runs in each of the operation patterns, and the maximal temperatures (at the end of charging in each cycle, top two lines in each graph) in the two runs in each of the operation patterns. It is noted that current adjustments reduce the temperature of the operating battery be several degrees (e.g., reduce the average temperature from ca. 38° C. to ca. 35° C. and reduce the maximal temperature from ca. 39° C. to ca. 36° C., or even lower), a factor which may contribute further to extending the cycling lifetime of battery 90.

Figure 19:
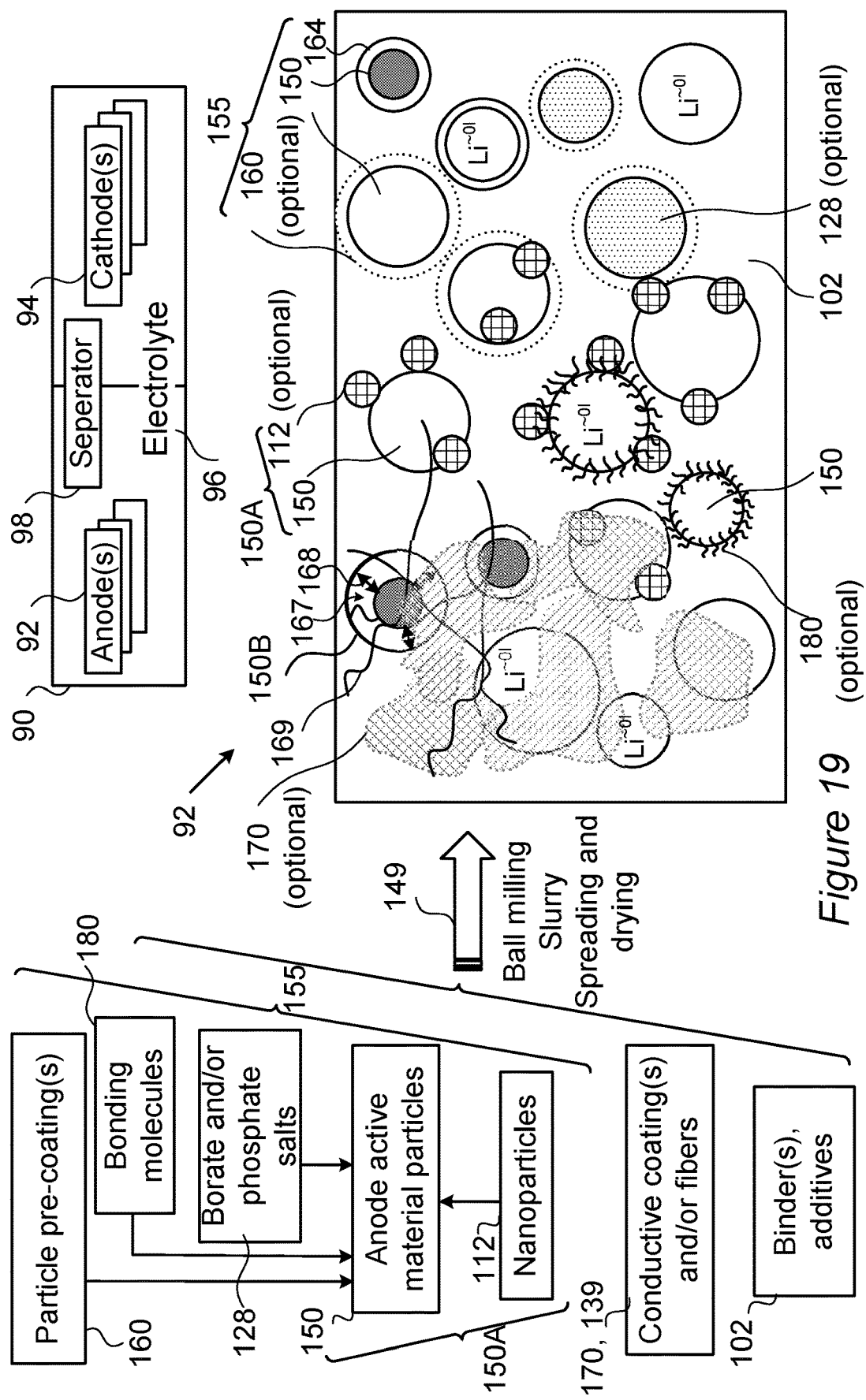
FIG. 19 is a high-level schematic illustration of various anode configurations, according to some embodiments of the invention.

FIG. 19 is a high-level schematic illustration of various anode configurations, according to some embodiments of the invention. FIG. 19 illustrates schematically, in a non-limiting manner, a surface of anode 92, which may comprise anode active material particles 150. Anode active material particles 150 may be of various types, at least some of which comprising particles of metalloids such as silicon, germanium and/or tin, and/or possibly particles of aluminum, lead and/or zinc, and/or Sn-decorated graphene active material particles, as well as forms of lithium titanate (LTO), their alloys and/or mixtures, and possibly particles of graphite and/or graphene. Anode active material particles 150 may be at diameters in the order of magnitude of 100 nm (e.g., 100-500 nm), and/or possibly in the order of magnitude of 10 nm or 1μ. At least some of anode active material particles 150 may possibly comprise composite particles 155, e.g., core-shell particles in various configurations. Anode active material particles 150 may comprise particles at different sizes (e.g., in the order of magnitude of 100 nm, and/or possibly in the order of magnitude of 10 nm or 1μ)—for receiving lithiated lithium during charging and releasing lithium ions during discharging. At least some of composite particles 155 may be based on Sn-decorated graphene active material particles 150 as their cores.

Anodes 92 may further comprise binder(s) and additive(s) 102 as well as optionally coatings 170 (e.g., conductive material such as carbon fibers and/or nanotubes 169, conductive polymers, lithium polymers, etc.). Coatings 170 may be applied to patches or parts of the surface of anode 92, and/or coatings 160 which may be applied onto anode material particles 150, and/or coatings 164 which may be configured as shells with anode material particles 150 as cores, and/or conductive material 169 such as carbon fibers and/or nanotubes may be configured to interconnect anode material particles 150 and/or interconnect anode material particles 150 as cores of core-shell particles 155. Active material particles 150 may be pre-coated by one or more coatings 160 (e.g., by carbon coating 160, conductive polymers, lithium polymers, etc.), have borate and/or phosphate salt(s) 128 bond to their surface (possibly forming e.g., $B_2O_3$, $P_2O_5$ etc.), bonding molecules 180 (illustrated schematically) which may interact with electrolyte 96 (and/or ionic liquid additives thereto) and/or various nanoparticles 112 (e.g., $B_4C$, WC, VC, TiN, possibly Si and/or Sn nanoparticles), forming modified anode active material particles 150A, which may be attached thereto in anode preparation processes 149 such as ball milling (see, e.g., U.S. Pat. No. 9,406,927, which is incorporated herein by reference in its entirety), slurry formation, spreading of the slurry and drying the spread slurry. Nanoparticles 112 may have diameters smaller than the diameters of anode active material particles 150, e.g., in the order of magnitude of 10 nm (e.g., 10-50 nm). For example, anode preparation processes 149 may comprise mixing additive(s) 102 such as e.g., binder(s) (e.g., polyvinylidene fluoride, PVDF, styrene butadiene rubber, SBR, or any other binder), plasticizer(s) and/or conductive filler(s) with a solvent such as water or organic solvent(s) (in which the anode materials have limited solubility) to make an anode slurry which is then dried, consolidated and is positioned in contact with a current collector (e.g., a metal, such as aluminum or copper).

In certain embodiments, bonding molecules 180 comprise any of the molecules disclosed in WIPO Document No. PCT/IL2017/051358, which is incorporated herein by reference in its entirety; non-limiting examples comprise lithium alkylsulfonate, poly(lithium alkylsulfonate), lithium sulfate, lithium phosphate, lithium phosphate monobasic, alkylhydroxamate salts and their acidic forms; for example—lithium 4-methylbenzenesulfonate, lithium 3,5-dicarboxybenzenesulfonate, lithium sulfate, lithium phosphate, lithium phosphate monobasic, lithium trifluoromethanesulfonate, lithium 4-dodecylbenzenesulfonate, lithium propane-1-sulfonate, lithium 1,1,2,2,3,3,4,4,5,5,6,6,7,7,8,8,8-heptadecafluorooctane-1-sulfonate, lithium 2,6-dimethylbenzene-1,4-disulfonate, lithium 2,6-di-tert-butylbenzene-1,4-disulfonate, 3,3'-((1,2-dithiane-4,5-diyl)bis(oxy))bis(N-hydroxypropanamide), 3,3'-((4-mercapto-1,2-phenylene)bis(oxy))bis(N-hydroxypropanamide), lithium aniline sulfonate (the sulfonate may be in any of para, meta and ortho positions) as well as poly(lithium-4-styrenesulfonate) applied in coating the anode material particles.

Certain embodiments comprise anode material particles 150 comprising any of silicon active material, germanium active material and/or tin active material, possibly further comprising carbon material, boron and/or tungsten. As non-limiting examples, anode material particles 150 may comprise 5-50 weight % Si, 2-25 weight % B and/or 5-25 weight % W, and 0.01-15 weight % C (e.g., as carbon nanotubes, CNT); anode material particles 150 may comprise 5-80 weight % Ge, 2-20 weight % B and/or 5-20 weight % W, and 0.05-5 weight % C (e.g., as carbon nanotubes, CNT); anode material particles 150 may comprise 5-80 weight % Sn, 2-20 weight % B and/or 5-20 weight % W, and 0.5-5 weight % C (e.g., as carbon nanotubes, CNT); anode material particles 150 may comprise mixtures of Si, Ge and Sn, e.g., at weight ratios of any of at least 4:1 (Ge:Si), at least 4:1 (Sn:Si) or at least 4:1 (Sn+Ge):Si; anode material particles 150 may comprise aluminum and/or any of zinc, cadmium and/or lead, possibly with additions of borate and/or phosphate salt(s) as disclosed below.

Certain embodiments comprise anode material particles 150 comprising nanoparticles 112 attached thereto, such as any of $B_4C$, WC, VC and TiN, possibly having a particle size range of 10-50 nm and providing 5-25 weight % of modified anode material particles 150A. Nanoparticles 112 may be configured to form in modified anode material particles 150A compounds such as $Li_2B_4O_7$ (lithium tetra-borate salt, e.g., via $4Li+7MeO+2B_4C \rightarrow 2Li_2B_4O_7+C+7Me$, not balanced with respect to C and O, with Me denoting active material such as Si, Ge, Sn etc.) or equivalent compounds from e.g., WC, VC, TiN, which have higher affinity to oxygen than the anode active material.

Certain embodiments comprise anode material particles 150 comprising coatings(s) 160 of any of lithium polymers, conductive polymers and/or hydrophobic polymers, such as e.g., any of lithium polyphosphate ($Li_{(n)}PP$ or LiPP), lithium poly-acrylic acid ($Li_{(n)}PAA$ or LiPAA), lithium carboxyl methyl cellulose ($Li_{(n)}CMC$ or LiCMC), lithium alginate ($Li_{(n)}Alg$ or LiAlg) and combinations thereof, with (n) denoting multiple attached Li; polyaniline or substituted polyaniline, polypyrroles or substituted polypyrroles and so forth.

Any of anode material particles 150, 150A, 150B may be coated by thin films (e.g., 1-50 nm, or 2-10 nm thick) of carbon (e.g., amorphous carbon, graphite, graphene, etc.) and/or transition metal oxide(s) (e.g., $Al_2O_3$, $B_2O_3$, $TiO_2$, $ZrO_2$, MnO etc.)

In certain embodiments, borate and/or phosphate salt(s) 112A may comprise borate salts such as lithium bis(oxalato)borate (LiBOB, $LiB(C_2O_4)_2$), lithium difluoro(oxalato)borate (LiFOB, $LiBF_2(C_2O_4)$), lithium tetraborate ($LiB_4O_7$), lithium bis(malonato)borate (LiBMB), lithium bis(trifluoromethanesulfonylimide) (LiTFSI), or any other compound which may lead to formation of borate salts ($B_2O_3$) on anode active material particles 150, including in certain embodiments $B_4C$ nanoparticles 112.

In certain embodiments, borate and/or phosphate salt(s) 112A may comprise phosphate salts such as lithium phosphate ($LiPO_4$), lithium pyrophosphate ($LiP_2O_7$), lithium tripolyphosphate ($LiP_3O_{10}$) or any other compound which may lead to formation of phosphate salts ($P_2O_5$) on anode active material particles 150.

Certain embodiments comprise composite anode material particles 150B which may be configured as core shell particles (e.g., the shell being provided by any of coating(s) 104 and possible modifications presented above). Different configurations are illustrated schematically in different regions of the illustrated anode surface, yet embodiments may comprise any combinations of these configurations as well as any extent of anode surface with any of the disclosed configurations. Anode(s) 92 may then be integrated in cells 90 which may be part of lithium ion batteries, together with corresponding cathode(s) 94, electrolyte 96 and separator 98, as well as other battery components (e.g., current collectors, electrolyte additives—see below, battery pouch, contacts, and so forth).

In certain embodiments, anode 92 may comprise conductive fibers 169 which may extend throughout anode 92 (illustrated, in a non-limiting manner, only at a section of anode 92) interconnect cores 150 and interconnected among themselves. Electronic conductivity may be enhanced by any of the following: binder and additives 102, coatings 170, conductive fibers 169, nanoparticles 112 and pre-coatings 164, which may be in contact with electronic conductive material (e.g., fibers) 169.

Lithium ion cell 90 may comprise anode(s) 92 (in any of its configurations disclosed herein) made of anode material with composite anode material such as any of anode material particles 150, 150A, 150B, electrolyte 96 and at least cathode 94 delivering lithium ions during charging through cell separator 98 to anode 92. Lithium ions (Li$^+$) are lithiated (to Li$^{-01}$, indicating substantially non-charged lithium, in lithiation state) when penetrating the anode material, e.g., into anode active material cores 150 (possibly of core-shell particles 150B). Any of the configurations of composite anode material and core-shell particles 150B presented below may be used in anode 92, as particles 150B are illustrated in a generic, non-limiting way. In core-shell particle configurations 150B, the shell may be at least partly provided by coating(s) 164, and may be configured to provide a gap 167 for anode active material 150 to expand 168 upon lithiation. In some embodiments, gap 167 may be implemented by an elastic or plastic filling material and/or by the flexibility of coating(s) 164 which may extend as anode active material cores 150 expands and thereby effective provide room for expansion 168, indicated in FIG. 19 schematically, in a non-limiting manner as gap 167. Examples for both types of gaps 167 are provided below, and may be combined, e.g., by providing small gap 167 and enabling further place for expansion by the coating flexibility.

Figure 20A:
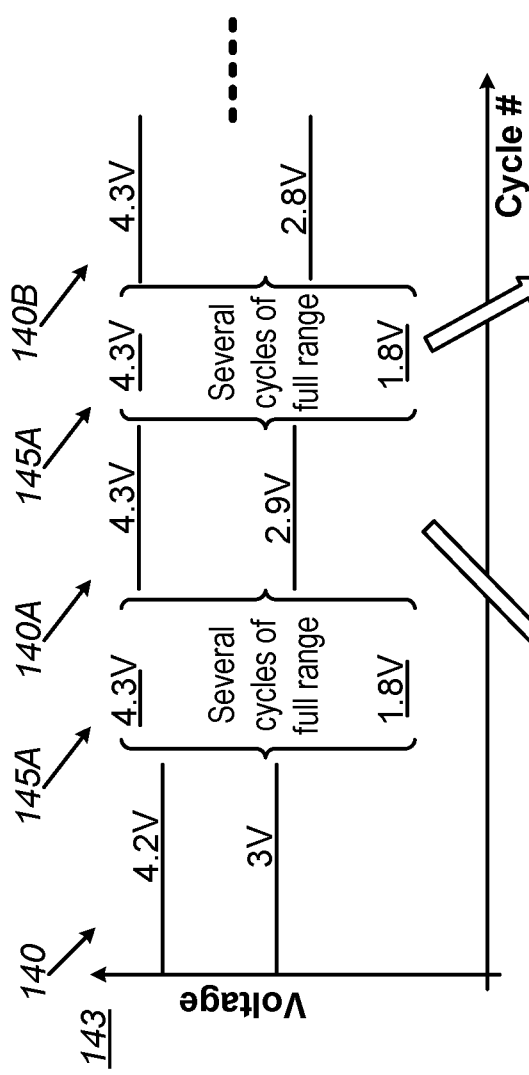
FIGS. 20A-C provide a schematic model for lithiation and de-lithiation of the anode material particles during operation of the battery, according to some embodiments of the invention.
Figure 20B:
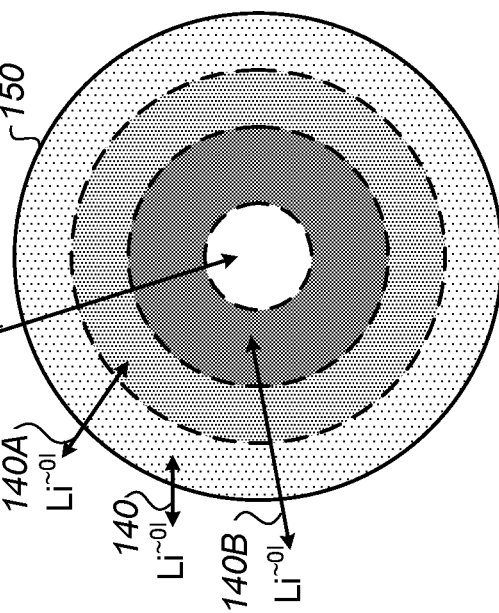
Figure 20C:
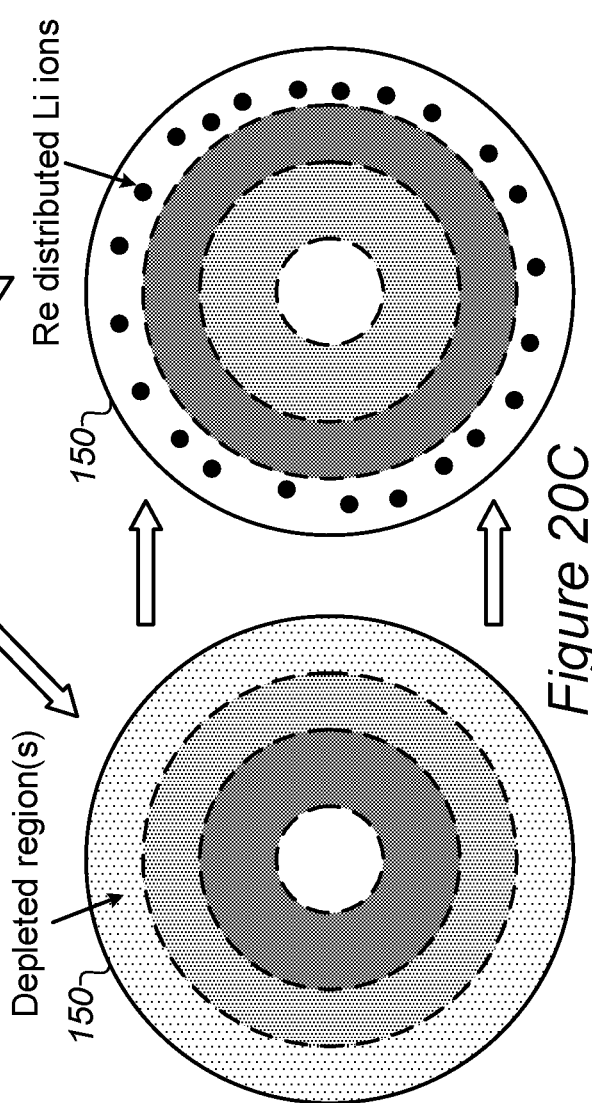

FIGS. 20A-C provide schematic models for lithiation and de-lithiation of the anode material particles during operation of the battery, according to some embodiments of the invention. The inventors suggest, without being bound by theory, that different ranges of operation voltages 140 result in lithiation of different parts of anode material particles 150. In various embodiments of anode material particle 150, lithiation may be carried out according to different spatial relations, e.g., core-shell particles having cores that are interconnected by carbon fibers 169 (see FIG. 19) may be lithiated inside-outwards, yet still exhibit zones of lithiation that correspond to the applied operation voltage range. FIGS. 20A and 20B illustrate schematically models of core-shell particles 150 and of spherical particles 150, respectively, for which lithiation may be carried out from the center outwards (expanding core 168 into gap 167) or from the periphery of the particle inwards, in FIGS. 20A and 20B, respectively, as lithiation is carried out in increasing voltage ranges from narrow range 140, through intermediate ranges 140A . . . N to wide (prior art) voltage range 145. The inventors suggest that changing the operating voltage range may result in non-uniform distribution of lithium ions throughout anode material particle 150, which may cause non-uniform degradation thereof.

FIG. 20C illustrates certain embodiments of operation pattern 143 (see e.g., FIG. 13) comprising one or several cycles of full voltage range operation 145A, which are included intermittently in patterns 143 comprising gradual increase of the voltage range—to effect occasional redistribution of lithium ions in anode material particles 150. For example, without being bound to theory, narrow operation window 140 may cause more intense lithiation and de-lithiation of outer regions of anode material particles 150, possibly degrading the corresponding regions more intensively than other regions of anode material particles 150, resulting in lithium ion losses from these regions. Several cycles of full range 145A may be performed to re-distributed Li ions from the inner parts to upper layers of anode material particles 150, to counter the resulting degradation due to narrow voltage range operation. For example, sets of few (e.g., 1-3, 1-5, or 1-10) full voltage range cycles 145A configured to redistribute lithium ions in anode material particles of the battery may be introduced intermittently, within operation pattern 143 of gradually increasing voltage ranges 140, 140A . . . N.

Anode material particles 150, 150A, 150B, anodes 92 and cells 90 may be configured according to the disclosed principles to enable high charging and/or discharging rates (C-rate), ranging from 3-10 C-rate, 10-100 C-rate or even above 100 C, e.g., 5 C, 10 C, 15 C, 30 C, 100 C or more. It is noted that the term C-rate is a measure of charging and/or discharging of cell/battery capacity, e.g., with 1 C denoting charging and/or discharging the cell in an hour, and XC (e.g., 5 C, 10 C, 50 C etc.) denoting charging and/or discharging the cell in 1/X of an hour—with respect to a given capacity of the cell.

Examples for electrolyte 96 may comprise liquid electrolytes such as ethylene carbonate, diethyl carbonate, propylene carbonate, VC, FEC, EMC, DMC and combinations thereof and/or solid electrolytes such as polymeric electrolytes such as polyethylene oxide, fluorine-containing polymers and copolymers (e.g., polytetrafluoroethylene), and combinations thereof. Electrolyte 96 may comprise lithium electrolyte salt(s) such as LiPF$_6$, LiBF$_4$, lithium bis(oxalato) borate, LiN(CF$_3$SO$_2$)$_2$, LiN(C$_2$F$_5$SO$_2$)$_2$, LiAsF$_6$, LiC(CF$_3$SO$_2$)$_3$, LiClO$_4$, LiTFSI, LiB(C$_2$O$_4$)$_2$, LiBF$_2$(C$_2$O$_4$)), tris(trimethylsilyl)phosphite (TMSP), and combinations thereof.

Ionic liquid(s) may be added to electrolyte 96 as disclosed in WIPO Document No. PCT/IL2017/051358, which is incorporated herein by reference in its entirety; non-limiting examples comprise at most 20%, at most 10% or at most 5% of e.g., sulfonylimides-piperidinium derivatives ionic liquid(s), selected to have a melting temperature below 10° C., below 0° C. or below −4° C., in certain embodiments.

In certain embodiments, cathode(s) 94 may comprise materials based on layered, spinel and/or olivine frameworks, and comprise various compositions, such as LCO formulations (based on LiCoO$_2$), NMC formulations (based on lithium nickel-manganese-cobalt), NCA formulations (based on lithium nickel cobalt aluminum oxides), LMO formulations (based on LiMn$_2$O$_4$), LMN formulations (based on lithium manganese-nickel oxides) LFP formulations (based on LiFePO$_4$), lithium rich cathodes, and/or combinations thereof.

It is explicitly noted that in certain embodiments, cathodes and anodes may be interchanged as electrodes in the disclosed cells, and the use of the term anode is not limiting the scope of the invention. Any mention of the term anode may be replaced in some embodiments with the terms electrode and/or cathode, and corresponding cell elements may be provided in certain embodiments. For example, in cells 90 configured to provide both fast charging and fast discharging, one or both electrodes 92, 94 may be prepared according to embodiments of the disclosed invention.

Separator(s) 98 may comprise various materials, e.g., polymers such as any of polyethylene (PE), polypropylene (PP), polyethylene terephthalate (PET), poly vinylidene fluoride (PVDF), polymer membranes such as a polyolefin, polypropylene, or polyethylene membranes. Multi-membranes made of these materials, micro-porous films thereof, woven or non-woven fabrics etc. may be used as separator(s) 98, as well as possibly composite materials including, e.g., alumina, zirconia, titania, magnesia, silica and calcium carbonate along with various polymer components as listed above.

It is explicitly noted that in certain embodiments, cathodes may be prepared according to disclosed embodiments, and the use of the term anode is not limiting the scope of the invention. Any mention of the term anode may be replaced in some embodiments with the terms electrode and/or cathode, and corresponding cell elements may be provided in certain embodiments. For example, in cells 90 configured to provide both fast charging and fast discharging, one or both electrodes 92, 94 may be prepared according to embodiments of the disclosed invention.

Different configurations of anodes 92 are illustrated schematically in different regions of the illustrated anode surface, yet embodiments may comprise any combinations of these configurations as well as any extent of anode surface with any of the disclosed configurations. Anode(s) 92 may then be integrated in cells 90 which may be part of lithium ion batteries, together with corresponding cathode(s) 94, electrolyte 96 and separator 98, as well as other battery components (e.g., current collectors, electrolyte additives, battery pouch, contacts, and so forth).

Anode material particles 150, 150A, 155, anodes 92 and cells 90 may be configured according to the disclosed principles to enable high charging and/or discharging rates (C-rate), ranging from 3-10 C-rate, 10-100 C-rate or even above 100 C, e.g., 5 C, 10 C, 15 C, 30 C or more. It is noted that the term C-rate is a measure of charging and/or discharging of cell/battery capacity, e.g., with 1 C denoting charging and/or discharging the cell in an hour, and XC (e.g., 5 C, 10 C, 50 C etc.) denoting charging and/or discharging the cell in 1/X of an hour—with respect to a given capacity of the cell.

Examples for electrolyte 96 may comprise liquid electrolytes such as ethylene carbonate, diethyl carbonate, propylene carbonate, fluoroethylene carbonate (FEC), EMC (ethyl methyl carbonate), DMC (dimethyl carbonate), VC (vinylene carbonate) and combinations thereof and/or solid electrolytes such as polymeric electrolytes such as polyethylene oxide, fluorine-containing polymers and copolymers (e.g., polytetrafluoroethylene), and combinations thereof. Electrolyte 96 may comprise lithium electrolyte salt(s) such as $LiPF_6$, $LiBF_4$, lithium bis(oxalato)borate, $LiN(CF_3SO_2)_2$, $LiN(C_2F_5SO_2)_2$, $LiAsF_6$, $LiC(CF_3SO_2)_3$, $LiClO_4$, LiTFSI, $LiB(C_2O_4)_2$, $LiBF_2(C_2O_4)$, tris(trimethylsilyl)phosphite (TMSP) and combinations thereof. Ionic liquid(s) may be added to electrolyte 96.

In certain embodiments, cathode(s) 94 may comprise materials based on layered, spinel and/or olivine frameworks, and comprise various compositions, such as LCO formulations (based on $LiCoO_2$), NMC formulations (based on lithium nickel-manganese-cobalt), NCA formulations (based on lithium nickel cobalt aluminum oxides), LMO formulations (based on $LiMn_2O_4$), LMN formulations (based on lithium manganese-nickel oxides) LFP formulations (based on $LiFePO_4$), lithium rich cathodes, and/or combinations thereof. Separator(s) 98 may comprise various materials, such as polyethylene (PE), polypropylene (PP) or other appropriate materials.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A method of preparing a fast-charging lithium ion cell, the method comprising:
   forming a solid-electrolyte interphase (SEI) in the anode by:
   performing a first formation cycle of fully charging the cell and then discharging the cell, and
   performing, consecutively, a plurality of charge-discharge formation cycles, in which the cell is charged to a first capacity and discharged to a second capacity, wherein the first and second capacity are between 30% and 80% of maximal cell capacity in each of said plurality of charge-discharge formation cycles.

2. The method of claim 1, wherein the first formation cycle is carried out at 0.03 C and the consecutive plurality of charge-discharge formation cycles are carried out at 0.1 C.

3. The method of claim 1, wherein the first formation cycle is carried out at a variable rate, starting from under 0.02 C and increasing to over 0.3 C during the first formation cycle.

4. The method of claim 3, wherein the variable rate is determined with respect to a DC or an AC resistance of the cell.

5. A method of preparing a fast-charging lithium ion cell, the method comprising:
   forming a solid-electrolyte interphase (SEI) in the anode by:
   performing a first formation cycle of charging the cell to between 30 and 70% of a full cell capacity and then discharging the cell, and
   performing, consecutively, a plurality of charge-discharge formation cycles, in which the cell is charged to 80% of the full cell capacity and then discharged, in each of said plurality of charge-discharge formation cycles.

6. The method of claim 5, wherein the first formation cycle is carried out at 0.03 C and the consecutive plurality of charge-discharge formation cycles are carried out at 0.1 C.

7. The method of claim 6, wherein the first formation cycle is carried out at a variable rate, starting from under 0.02 C and increasing to over 0.3 C during the first formation cycle.

8. The method of claim 7, wherein the variable rate is determined with respect to a DC or an AC resistance of the cell.

9. A method of preparing a fast-charging lithium ion cell for use, the method comprising:

forming a solid-electrolyte interphase (SEI) in the anode by:

performing at least a first formation cycle of fully charging the cell and then discharging the cell, wherein a charging current in the first formation cycle is gradually increased during the first formation cycle, from under 0.02 C to over 0.3 C.

10. The method of claim 9, wherein a timing or rate of the gradual increase is determined with respect to a DC or an AC resistance of the cell.

11. A method of preparing a fast-charging lithium ion cell for use, the method comprising:

forming a solid-electrolyte interphase (SEI) in the anode by:

performing a first formation cycle of charging the cell and then discharging the cell, and performing, consecutively, a plurality of charge-discharge formation cycles, in which the cell is charged and discharged in each of the performed consecutive formation cycles, wherein at least one of the first formation cycle and the consecutive plurality of charge-discharge formation cycles are carried out up to a state of charge (SOC) of the cell which is 80% or less of a respective cell capacity.

12. The method of claim 11, wherein the first formation cycle is carried out at a gradually increasing rate, spanning at least a tenfold increase in charging rate during the first formation cycle.

* * * * *